United States Patent
Lee et al.

(10) Patent No.: US 10,741,577 B2
(45) Date of Patent: Aug. 11, 2020

(54) THREE-DIMENSIONAL SEMICONDUCTOR MEMORY DEVICES

(71) Applicant: Samsung Electronics Co., Ltd., Suwon-si, Gyeonggi-do (KR)

(72) Inventors: Bongyong Lee, Suwon-si (KR); Jaegoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/180,781

(22) Filed: Nov. 5, 2018

(65) Prior Publication Data

US 2019/0326315 A1    Oct. 24, 2019

(30) Foreign Application Priority Data

Apr. 23, 2018   (KR) .................. 10-2018-0046731

(51) Int. Cl.
*H01L 27/11582*    (2017.01)
*H01L 27/11568*    (2017.01)
(Continued)

(52) U.S. Cl.
CPC .. *H01L 27/11582* (2013.01); *H01L 27/11565* (2013.01); *H01L 27/11568* (2013.01); *H01L 29/1037* (2013.01); *H01L 29/41741* (2013.01); *H01L 29/42344* (2013.01); *H01L 21/266* (2013.01); *H01L 21/26513* (2013.01); *H01L 21/31053* (2013.01); *H01L 29/6653* (2013.01)

(58) Field of Classification Search
CPC ......... H01L 27/11582; H01L 27/11565; H01L 27/11568; H01L 29/42344; H01L 29/41741; H01L 29/1037; H01L 29/6653; H01L 21/31053; H01L 21/266; H01L 21/26513
USPC ....... 257/324, 326, 369, 306, 314, 315, 296, 257/773, 777, E27.026, E27.081, 257/E27.099, E27.103, E27.112, E23.141, 257/E23.145, E23.168, E29.262, E29.266, 257/E29.3, E29.309, E21.09, E21.19, 257/E21.209, E21.21, E21.409, E21.411, 257/E21.422; 438/268, 269, 257, 631; 365/185.03, 185.05, 185.17, 185.2
See application file for complete search history.

(56) References Cited

U.S. PATENT DOCUMENTS 8,441,059 B2    5/2013  Sim et al.
8,952,426 B2    2/2015  Maejima
(Continued)

*Primary Examiner* — Dao H Nguyen
(74) *Attorney, Agent, or Firm* — Sughrue Mion, PLLC

(57) ABSTRACT

A three-dimensional semiconductor memory device may include a substrate comprising a cell array region and a connection region, an electrode structure including a plurality of gate electrodes sequentially stacked on a surface of the substrate and extending from the cell array region to the connection region, a first source conductive pattern between the electrode structure and the substrate on the cell array region, and a cell vertical semiconductor pattern and a first dummy vertical semiconductor pattern that penetrate the electrode structure and the first source conductive pattern and extend into the substrate. The cell vertical semiconductor pattern may contact the first source conductive pattern. The first dummy vertical semiconductor pattern may be electrically insulated from the first source conductive pattern.

20 Claims, 32 Drawing Sheets

(51) Int. Cl.
  *H01L 29/423*    (2006.01)
  *H01L 29/417*    (2006.01)
  *H01L 27/11565*  (2017.01)
  *H01L 29/10*     (2006.01)
  *H01L 29/66*     (2006.01)
  *H01L 21/266*    (2006.01)
  *H01L 21/265*    (2006.01)
  *H01L 21/3105*   (2006.01)

(56) References Cited

U.S. PATENT DOCUMENTS

| | | | |
|---|---|---|---|
| 9,659,866 B1 | 5/2017 | Ishigaki | |
| 9,876,031 B1 | 1/2018 | Shimizu et al. | |
| 9,881,931 B2 | 1/2018 | Lee | |
| 2015/0318301 A1* | 11/2015 | Lee | H01L 29/7926 257/324 |
| 2016/0293627 A1* | 10/2016 | Kim | H01L 27/11565 |
| 2017/0194326 A1* | 7/2017 | Kim | H01L 23/5283 |
| 2017/0207221 A1* | 7/2017 | Kim | H01L 27/1052 |
| 2017/0207226 A1 | 7/2017 | Lee | |
| 2017/0365616 A1 | 12/2017 | Kang et al. | |
| 2017/0373089 A1 | 12/2017 | Kim et al. | |
| 2018/0006054 A1 | 1/2018 | Liu et al. | |
| 2018/0026048 A1 | 1/2018 | Tsuji et al. | |
| 2018/0040553 A1* | 2/2018 | Tak | H01L 27/11529 |
| 2019/0288000 A1* | 9/2019 | Choi | H01L 29/0649 |

\* cited by examiner

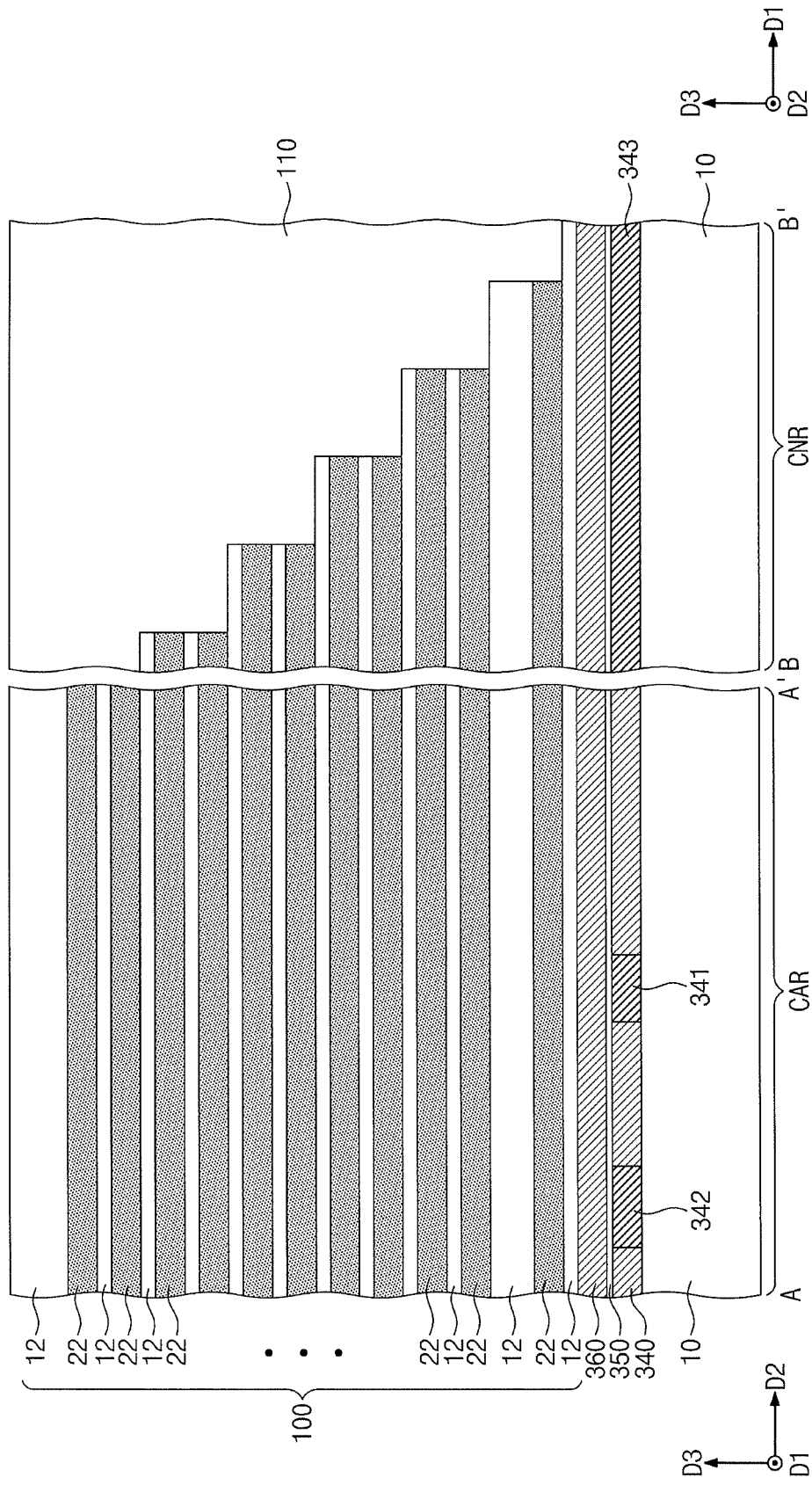

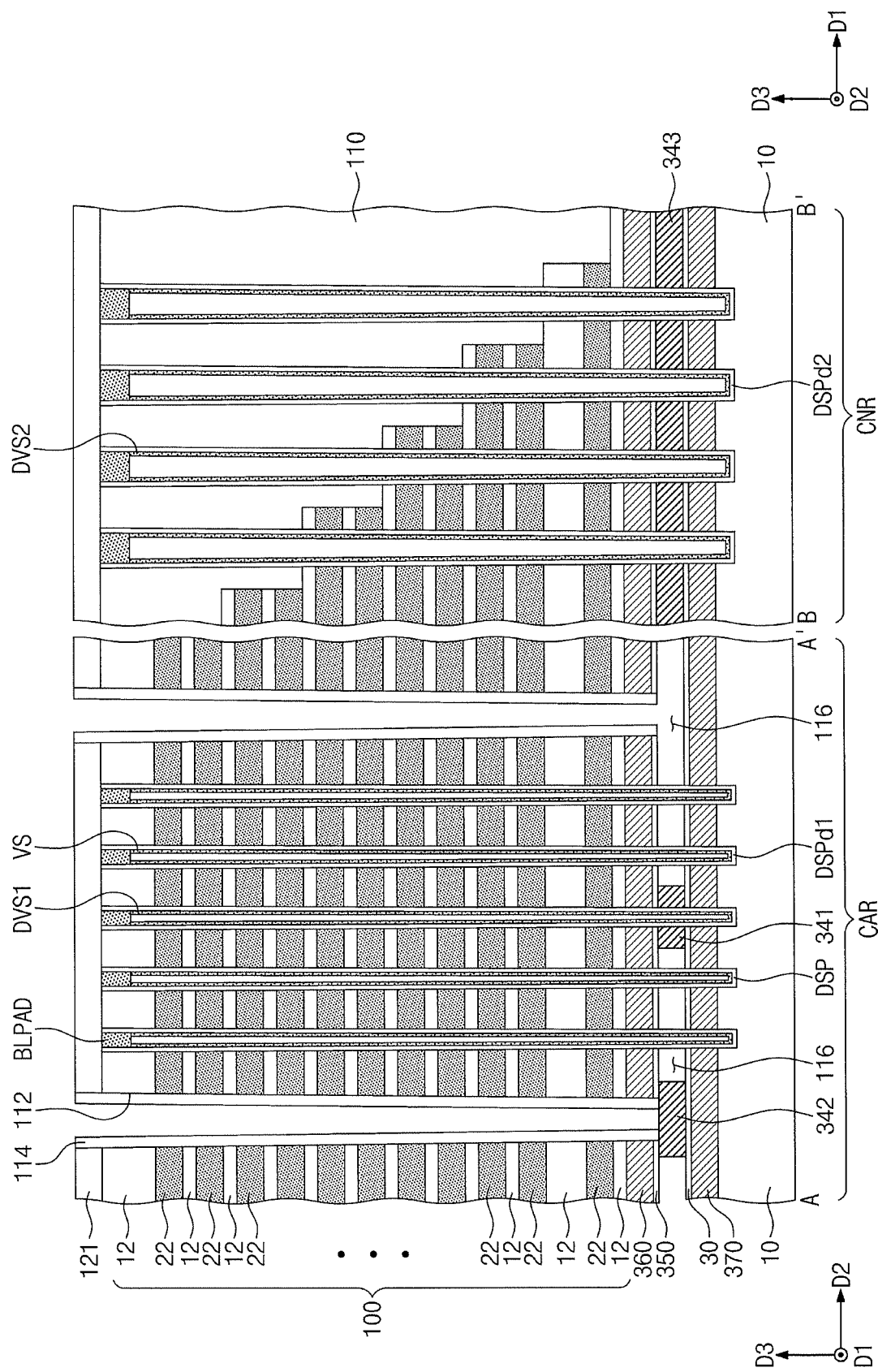

THREE-DIMENSIONAL SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2018-0046731 filed on Apr. 23, 2018 in the Korean Intellectual Property Office, the entire contents of which are hereby incorporated herein by reference in their entirety.

FIELD

Embodiments of the inventive concepts relate to three-dimensional semiconductor memory devices, and more particularly, to three-dimensional semiconductor memory devices with enhanced reliability and integration.

BACKGROUND

Semiconductor devices may be highly integrated for satisfying high performance and low manufacture costs. Since integration of the semiconductor devices may be an important factor in determining product price, high integration may be increasingly requested. Integration of typical two-dimensional or planar semiconductor memory devices may be primarily determined by the area occupied by a unit memory cell, such that it may be greatly influenced by the level of technology for forming fine patterns. However, the extremely expensive processing equipment needed to increase pattern fineness may set a practical limitation on increasing the integration of the two-dimensional or planar semiconductor memory devices. Therefore, there have been proposed three-dimensional semiconductor memory devices having three-dimensionally arranged memory cells.

SUMMARY

Some embodiments of inventive concepts provide three-dimensional semiconductor memory devices with enhanced reliability and integration.

According to some embodiments of inventive concepts, a three-dimensional semiconductor memory device may include a substrate comprising a cell array region and a connection region, an electrode structure including a plurality of gate electrodes sequentially stacked on a surface of the substrate and extending from the cell array region to the connection region, a first source conductive pattern between the electrode structure and the substrate on the cell array region, and a cell vertical semiconductor pattern and a first dummy vertical semiconductor pattern on the cell array region that penetrate the electrode structure and the first source conductive pattern and extend into the substrate. The cell vertical semiconductor pattern may contact the first source conductive pattern. The first dummy vertical semiconductor pattern may be electrically insulated from the first source conductive pattern.

According to some embodiments of inventive concepts, a three-dimensional semiconductor memory device may include an electrode structure including a plurality of gate electrodes sequentially stacked on a substrate, a source structure between the electrode structure and the substrate, a bit line on the electrode structure, and a dummy vertical semiconductor pattern penetrating the electrode structure and the source structure and extending into the substrate. The dummy vertical semiconductor pattern may be electrically insulated from the bit line and electrically insulated from the source structure.

According to some embodiments of inventive concepts, a three-dimensional semiconductor memory device may include an electrode structure including a plurality of gate electrodes sequentially stacked on a substrate, a cell vertical semiconductor pattern on the substrate, a source structure between the electrode structure and the substrate, and a source contact plug penetrating the electrode structure and electrically connected to the source structure. The cell vertical semiconductor pattern may penetrate the electrode structure and penetrate the source structure. A bottom surface of the source contact plug may have an uneven structure.

BRIEF DESCRIPTION OF THE DRAWINGS

FIGS. 7A to 7J are cross-sectional views illustrating operations of methods of fabricating three-dimensional semiconductor memory devices having the cross-section of FIG. 4.

FIGS. 11A to 11E illustrate cross-sectional views illustrating operations of methods of fabricating three-dimensional semiconductor memory devices having the cross-section of FIG. 9.

DETAILED DESCRIPTION OF EMBODIMENTS

Some embodiments of inventive concepts will now be described in detail with reference to the accompanying drawings to aid in clearly explaining aspects of the inventive concepts.

Figure 1:
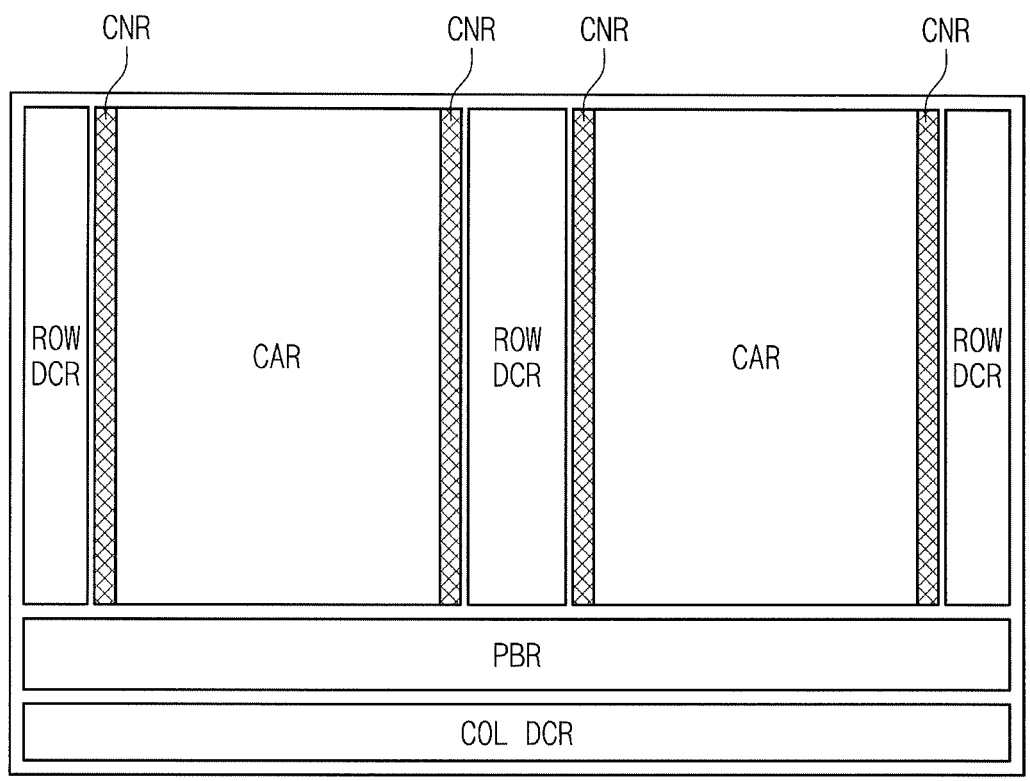
FIG. 1 is a schematic diagram illustrating a simplified configuration of a three-dimensional semiconductor memory device according to some embodiments of inventive concepts.

FIG. 1 is a schematic diagram illustrating a simplified configuration of a three-dimensional semiconductor memory device according to some embodiments of inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region. In some embodiments, connection regions CNR may be between the cell array region CAR and the row decoder regions ROW DCR.

The cell array region CAR may include a memory cell array consisting of a plurality of memory cells. In some embodiments, the memory cell array may include a plurality of memory blocks each of which is a data erase unit. Each of the memory blocks may include three-dimensionally arranged memory cells, a plurality of word lines electrically connected to the memory cells, and a plurality of bit lines electrically connected to the memory cells.

The row decoder region ROW DCR may include a row decoder that selects the word lines of the memory cell array, and the connection region CNR may include a routing structure that electrically connects the memory cell array to the row decoder. In accordance with address information, the row decoder may select one of the word lines of the memory cell array. In response to a control signal from a control circuit, the row decoder may provide word line voltages to the selected word line and unselected word lines.

The page buffer region PBR may include a page buffer that reads data stored in the memory cells. Depending on an operating mode, the page buffer may temporarily store data to be stored in the memory cells or sense data stored in the memory cells. The page buffer may function as a write driver circuit in a program mode and as a sense amplifier circuit in a read mode.

The column decoder region COL DCR may include a column decoder connected to the bit lines of the memory cell array. The column decoder may provide a data transmission path between the page buffer and an external device (e.g., a memory controller).

Figure 2:
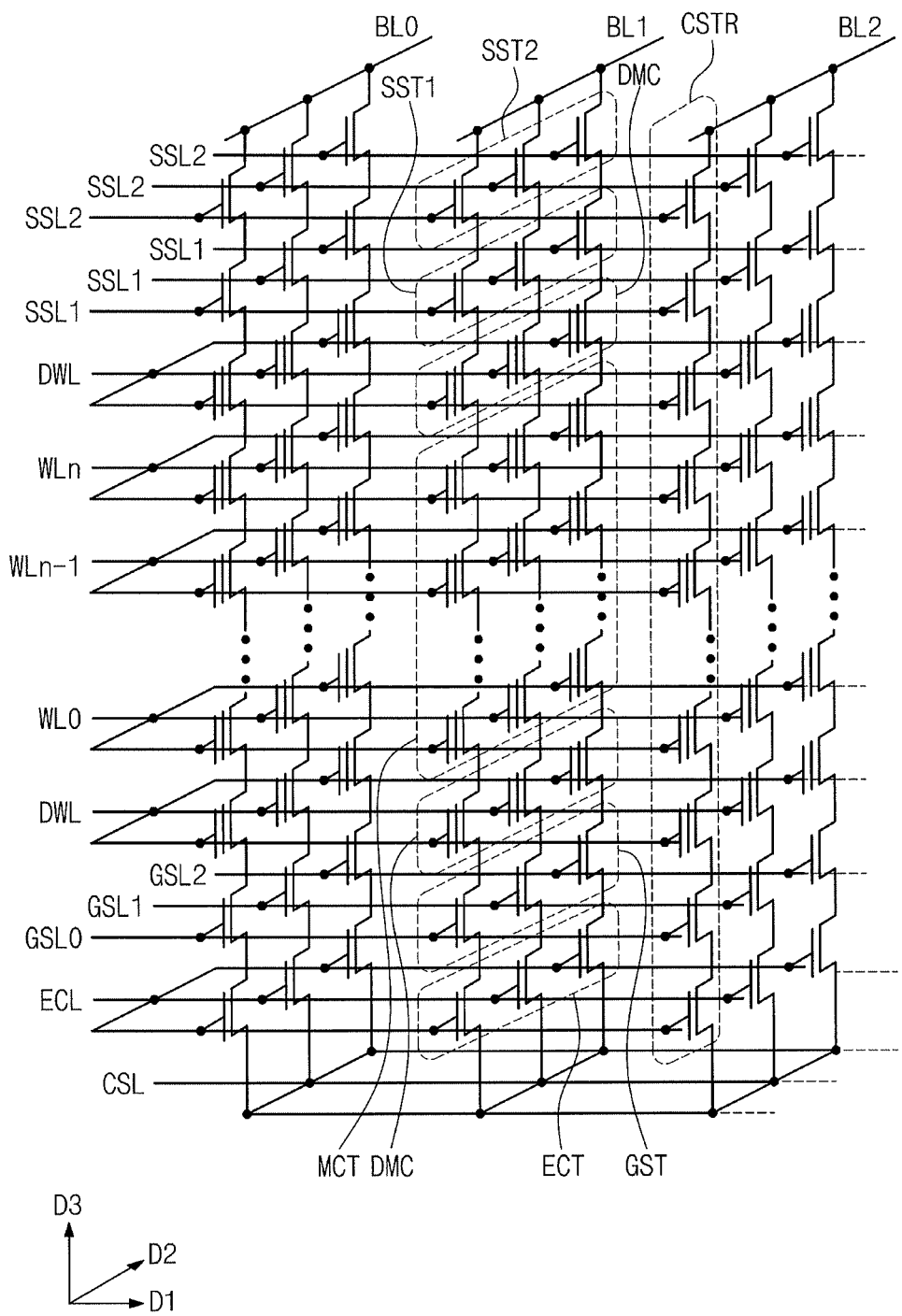
FIG. 2 is a circuit diagram illustrating a cell array of a three-dimensional semiconductor memory device according to some embodiments of inventive concepts.

FIG. 2 is a circuit diagram illustrating a cell array of a three-dimensional semiconductor memory device according to some embodiments of inventive concepts.

Referring to FIG. 2, a cell array of a three-dimensional semiconductor memory device may include a common source line CSL, a plurality of bit lines BL0 to BL2, and a plurality of cell strings CSTR between the common source line CSL and the bit lines BL0 to BL2.

The cell strings CSTR may be two-dimensionally arranged along first and second directions D1 and D2 and may extend along a third direction D3. The bit lines BL0 to BL2 may be spaced apart from each other in the first direction D1 and may extend in the second direction D2.

Each of the bit lines BL0 to BL2 may have a plurality of cell strings CSTR connected to it in parallel. The cell strings CSTR may be connected in common to the common source line CSL. For example, each of the plurality of cell strings CSTR may be between one of the bit lines BL0 to BL2 and the common source line CSL, as illustrated. In some embodiments, the common source line CSL may be a plurality of common source lines CSL arranged two-dimensionally. The common source lines CSL may be supplied with the same voltage or electrically controlled independently of each other.

In some embodiments, each of the cell strings CSTR may include string select transistors SST1 and SST2 connected in series, memory cell transistors MCT connected in series, a ground select transistor GST, and an erase control transistor ECT. Each of the memory cell transistors MCT may include a data storage element.

In some embodiments, each of the cell strings CSTR may include the first and second string select transistors SST1 and SST2 connected in series, and the second string select transistor SST2 may be coupled to one of the bit lines BL0 to BL2. In some embodiments, each of the cell strings CSTR may include one string select transistor. In some embodiments, similar to the first and second string select transistors SST1 and SST2, the ground select transistor GST may include a plurality of MOS transistors connected in series in each of the cell strings CSTR.

A cell string CSTR may include a plurality of memory cell transistors MCT at different distances from the common source line CSL. The memory cell transistors MCT may be connected in series between the first string select transistor SST1 and the ground select transistor GST. The erase control transistor ECT may be connected between the ground select transistor GST and the common source line CSL. Each of the cell strings CSTR may further include dummy cell transistors DMC, one of which connected between the first string select transistor SST1 and an uppermost one of the memory cell transistors MCT and other of which connected between the ground select transistor GST and a lowermost one of the memory cell transistors MCT.

In some embodiments, the first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cell transistors DMC may be controlled by dummy word lines DWL. The ground select transistor GST may be controlled by one of ground select lines GSL0, GSL1, and GSL2, and the erase control transistor ECT may be controlled by an erase control line ECL. The common source line CSL may be connected in common to sources of the erase control transistors ECT.

The memory cell transistors MCT may include gate electrodes at substantially the same distance from the common source line CSL that are connected in common to one of the word lines WL0 to WLn and DWL, such that these gate electrodes may be in an equipotential state. In some embodiments, the gate electrodes located at substantially the same distance from the common source lines CSL of the memory cell transistors MCT of different rows or columns may be independently controlled.

The ground select lines GSL0 to GSL2 and the string select lines SSL1 and SSL2 may extend along the first direction D1 and may be spaced apart from each other in the second direction D2. The ground select lines GSL0 to GSL2 may be located at substantially the same level from the common source lines CSL and may be electrically separated from each other. The string select lines SSL1 may be located at substantially the same level from the common source lines CSL and may be electrically separated from each other. The string select lines SSL2 may be located at substantially the same level from the common source lines CSL and may be electrically separated from each other. A common erase control line ECL may control the erase control transistors ECT included in different cell strings CSTR. The erase control transistors ECT may generate a gate induced drain leakage (GILD) in an erase mode.

Figure 3:
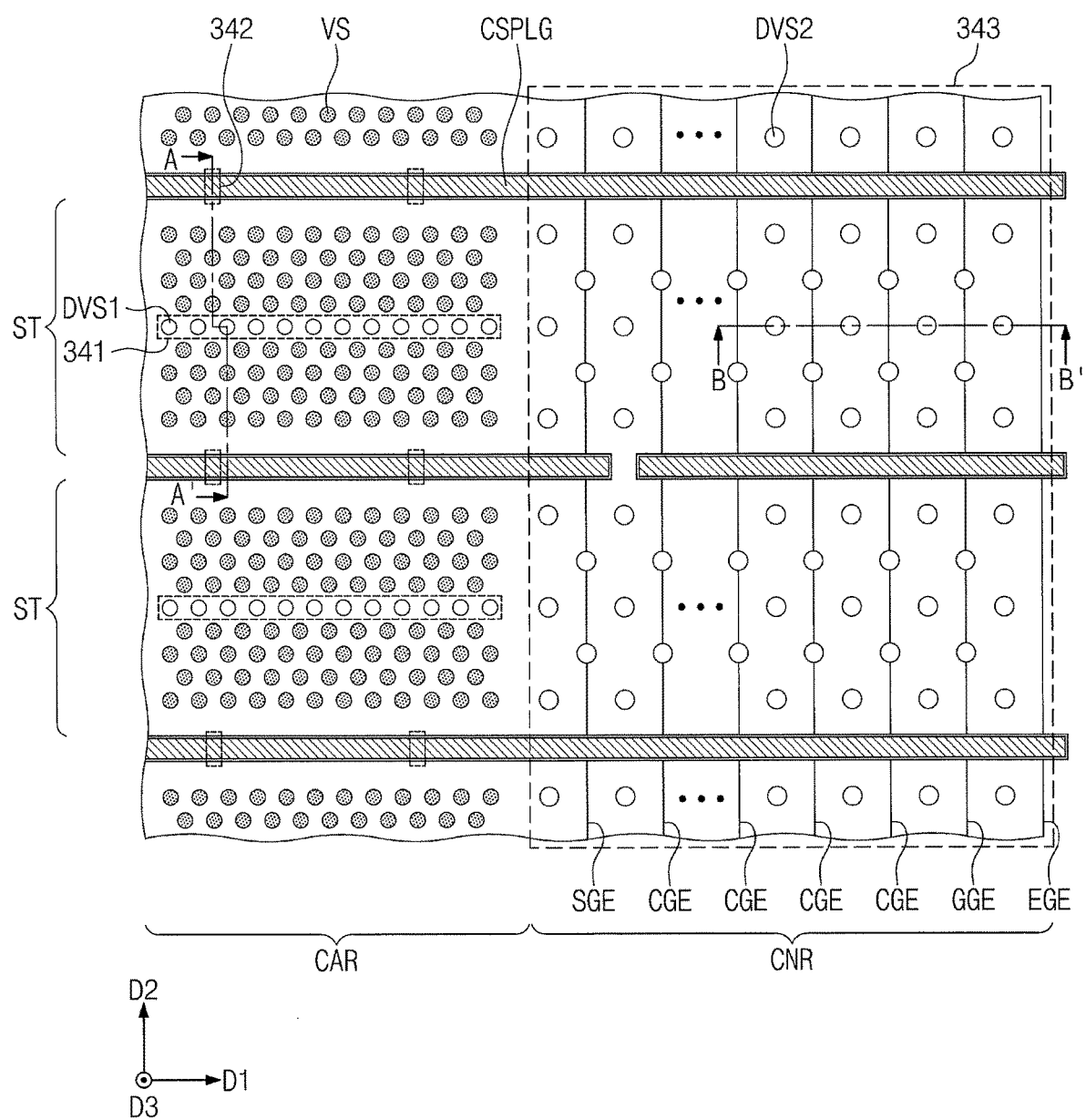
FIG. 3 is a plan view illustrating a three-dimensional semiconductor memory device according to some embodiments of inventive concepts.
Figure 4:
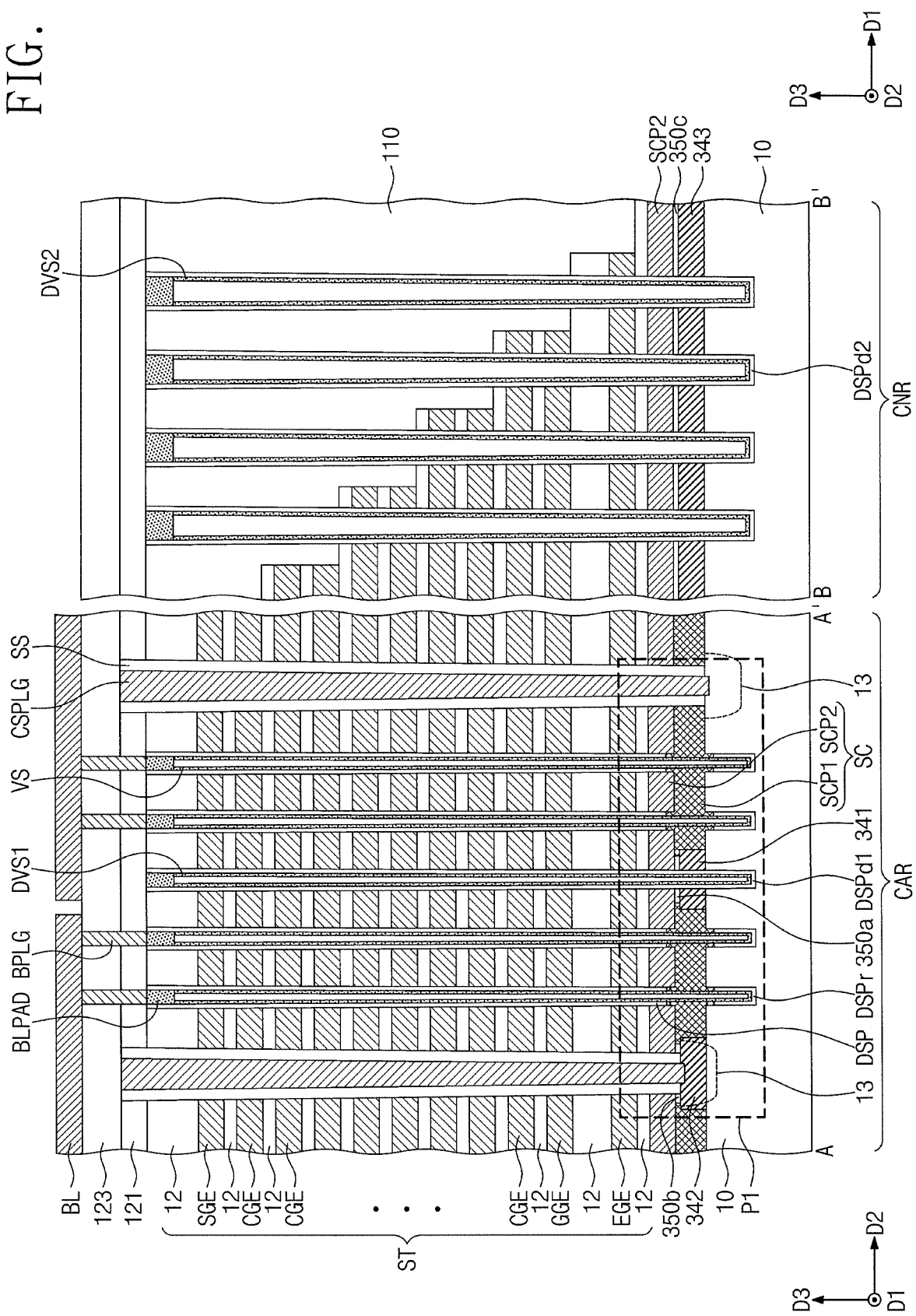
FIG. 4 is a cross-sectional view taken along lines A-A' and B-B' of FIG. 3, according to some embodiments of inventive concepts.
Figure 5:
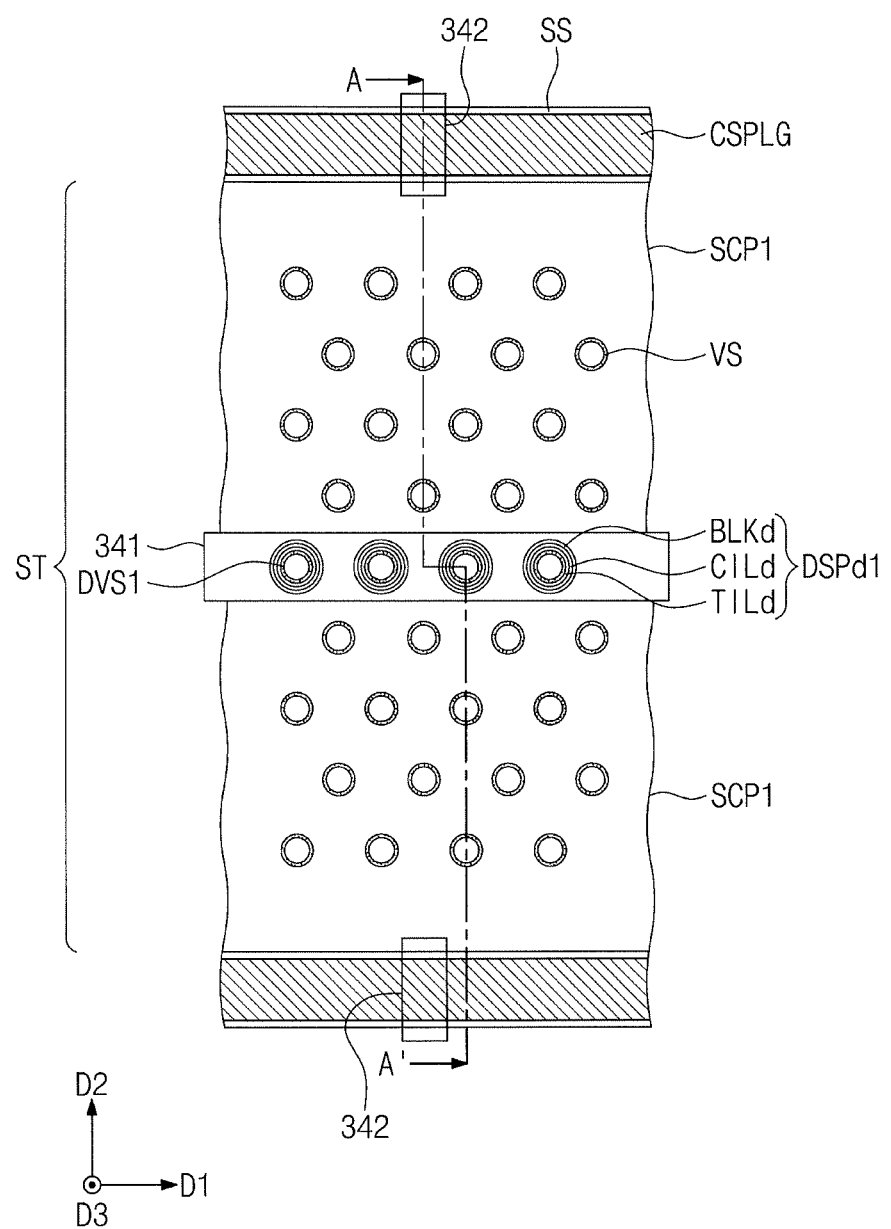
FIG. 5 is a detailed plan view illustrating a three-dimensional semiconductor memory device according to some embodiments of inventive concepts.
Figure 6A:
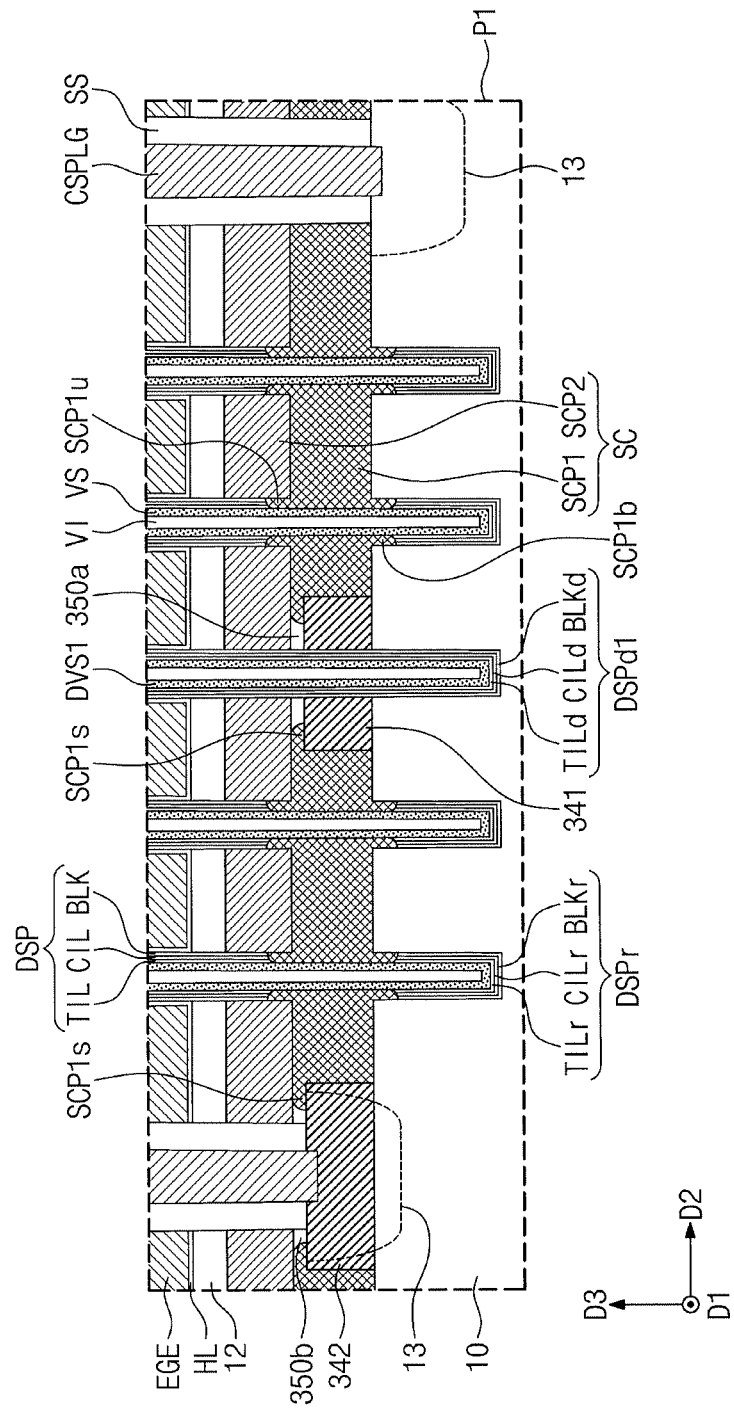
FIG. 6A is an enlarged view illustrating section P1 of FIG. 4.
Figure 6B:
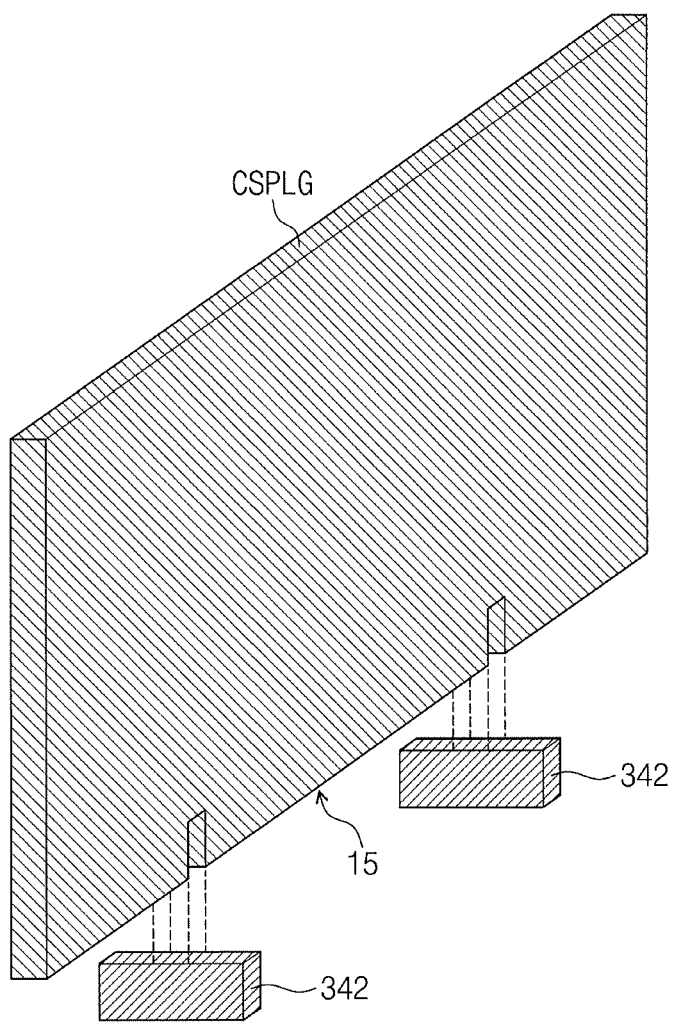
FIG. 6B is an exploded perspective view illustrating a connection relationship between a source contact plug and a second support pattern according to some embodiments of inventive concepts.

FIG. 3 is a plan view illustrating a three-dimensional semiconductor memory device according to some embodiments of inventive concepts. FIG. 4 is a cross-sectional view taken along lines A-A' and B-B' of FIG. 3, according to some embodiments of inventive concepts. FIG. 5 is a detailed plan view illustrating a three-dimensional semiconductor memory device according to some embodiments of inventive concepts. In particular, FIG. 5 may correspond to a detailed plan view of a three-dimensional semiconductor memory device when seen from a height of a first source conductive pattern SCP1 of FIG. 4. FIG. 6A is an enlarged view illustrating section P1 of FIG. 4. FIG. 6B is an exploded perspective view illustrating a connection relationship between a source contact plug and a second support pattern according to some embodiments of inventive concepts.

Referring to FIGS. 3 and 4, a substrate 10 may include a cell array region CAR and a connection region CNR. The connection region CNR may be located at an edge of the cell array region CAR. The substrate 10 may be one of a semiconductor material (e.g., silicon wafer), an insulating material (e.g., glass), and a semiconductor or conductor covered with an insulating material. The substrate 10 may be, for example, doped with impurities of a first conductivity type.

A three-dimensional semiconductor memory device according to some embodiments may include electrode structures ST on the substrate 10, and may also include a source structure SC between the electrode structures ST and the substrate 10. The cell array region CAR may include a plurality of cell vertical semiconductor patterns VS and a plurality of first dummy vertical semiconductor patterns DVS1. The vertical semiconductor patterns VS and DVS1 may penetrate the electrode structures ST and the source structure SC and may extend into the substrate 10. The first dummy vertical semiconductor patterns DVS1 within an electrode structure ST may be linearly arranged along a first direction D1. The first dummy vertical semiconductor patterns DVS1 may be on a center of the electrode structure ST. Cell data storage patterns DSP may be between the cell vertical semiconductor patterns VS and the electrode structures ST. First dummy data storage patterns DSPd1 may be between the first dummy vertical semiconductor patterns DVS1 and the electrode structures ST.

The electrode structures ST may extend along the first direction D1 from the cell array region CAR toward the connection region CNR and may have a stepwise structure on the connection region CNR. An electrode structure ST may be between source contact plugs CSPLG extending in the first direction D1. An insulation spacer SS made of an insulating material may be between the source contact plug CSPLG and the electrode structure ST. The source contact plugs CSPLG may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum).

The electrode structure ST may include gate electrodes EGE, GGE, CGE, and SGE that are stacked along a third direction D3 (or a vertical direction) perpendicular both to the first direction D1 and to a second direction D2. Each of the gate electrodes EGE, GGE, CGE, and SGE of the electrode structure ST may have a length in the first direction D1, which length may decrease with increasing distance from the substrate 10, and the electrode structure ST may have a height that decreases with increasing distance from the cell array region CAR. Each of the gate electrodes EGE, GGE, CGE, and SGE may have a pad portion on the connection region CNR.

In some embodiments, gate interlayer dielectric layers 12 may be between the gate electrodes EGE, GGE, CGE, and SGE. The gate electrodes EGE, GGE, CGE, and SGE may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum). The gate interlayer dielectric layers 12 may include a silicon oxide layer or a low-k dielectric layer.

The gate electrodes EGE, GGE, CGE, and SGE may include an erase control gate electrode EGE, ground select gate electrodes GGE, cell gate electrodes CGE, and a string select gate electrode SGE. The erase control gate electrode EGE, the ground select gate electrodes GGE, and the string select gate electrode SGE may each have two or more layers. Intervals (i.e., distances in the third direction D3) between the gate electrodes EGE, GGE, CGE, and SGE may be adjusted as needed. For example, an interval between the ground select gate electrode GGE and its most adjacent cell gate electrode CGE may be greater than an interval between the cell gate electrodes CGE. An interval between the string select gate electrode SGE and its most adjacent cell gate electrode CGE may be greater than the interval between the cell gate electrodes CGE.

The erase control gate electrode EGE may be adjacent to the source structure SC. The erase control gate electrode EGE may be used as a gate electrode of the erase control transistor (see ECT of FIG. 2) that generates a gate induced drain leakage (GIDL). The ground select gate electrodes CGE may be used as gate electrodes of the ground select transistors (see GST of FIG. 2) that control electrical connections between the common source line (see CSL of FIG. 2) and the cell vertical semiconductor patterns VS.

The cell gate electrodes CGE may be located at different levels (i.e., distances in the third direction D3) from a top surface of the substrate 10. The cell gate electrodes CGE may be used as the control gates (see WL0 to WLn and DWL of FIG. 2) of the memory and dummy cell transistors (see MCT and DMC of FIG. 2).

In some embodiments, separation insulation patterns may be between upper portions of the first dummy vertical semiconductor patterns DVS1. A string select gate electrode SGE may be divided into two pieces by the first dummy vertical semiconductor patterns DVS1 linearly arranged along the first direction D1 and by the separation insulation patterns between the upper portions of the first dummy vertical semiconductor patterns DVS1. For example, the divided pieces of the string select gate electrodes SGE may be spaced apart from each other in the second direction D2. The string select gate electrodes SGE may be used as gate electrodes of the second string select transistors (SST2 of FIG. 2) that control electrical connections between a bit line BL and the cell vertical semiconductor patterns VS.

On the cell array region CAR, the source structure SC may be between the electrode structure ST and the substrate 10. The source structure SC may be parallel to the top surface of the substrate 10. The source structure SC may include first and second source conductive patterns SCP1 and SCP2 that are sequentially stacked. The first source conductive pattern SCP1 may directly contact a top surface of the first source conductive pattern SCP1. The first source conductive pattern SCP1 may be formed of, for example, polysilicon doped with impurities of a second conductivity type. The second conductivity type may be opposite to the first conductivity type. The second source conductive pattern SCP2 may be formed of, for example, impurity-doped polysilicon or impurity-undoped polysilicon. Impurities doped in the second source conductive pattern SCP2 may have the second conductivity type. The impurities of the second conductivity type may be or include, for example, phosphorous (P) or arsenic (As).

Referring to FIGS. 3, 4, 5, 6A, and 6B, a first support pattern 341 may be between ones of the first dummy data storage patterns DSPd1 and the first source conductive pattern SCP1. When viewed in plan, the first support pattern 341 may have a linear shape extending along the first direction D1 and may surround the first dummy vertical semiconductor patterns DVS1 that intersect with the linear shape. Within an electrode structure ST, a first support pattern 341 may divide the first source conductive pattern SCP1 into two pieces. A first insulation pattern 350a may be between the first support pattern 341 and the second source conductive pattern SCP2. The first support pattern 341 may have a sidewall that laterally protrudes beyond an edge of the first insulation pattern 350a.

A second support pattern 342 may be between the substrate 10 and a portion of the source contact plug CSPLG. The first and second support patterns 341 and 342 may be formed of, for example, carbon-doped polysilicon. The second support pattern 342 may have an island shape, and a plurality of second support patterns 342 may be spaced apart from each other along the first direction D1. A second insulation pattern 350b may be between the second support pattern 342 and the second source conductive pattern SCP2. The second support pattern 342 may have a sidewall that laterally protrudes beyond an edge of the second insulation pattern 350b.

The source contact plug CSPLG may have a bottom surface 15 having an uneven structure. For example, the bottom surface 15 of the source contact plug CSPLG may have a height that varies with the position of the bottom surface 15. The source contact plug CSPLG may be configured in such a way that the bottom surface 15 contacting the second support pattern 342 may be higher than the bottom surface 15 contacting the substrate 10 as illustrated, for example, in FIGS. 4 and 6B. The substrate 10 may include an impurity-doped region 13 below the source contact plug CSPLG. The impurity-doped region 13 may also be in the second support pattern 342. The impurity-doped region 13 may be located at a height that varies with the position thereof. For example, the impurity-doped region 13 at the second support pattern 342 may be higher than the impurity-doped region 13 at any other location. The impurity-doped region 13 may be, for example, doped with impurities of the second conductivity type. The impurity-doped region 13 and at least the first source conductive pattern SCP1 of the source structure SC may correspond to the common source line CSL of FIG. 2.

The second source conductive pattern SCP2 may extend to cover the connection region CNR. On the connection region CNR, a third support pattern 343 may be between the second source conductive pattern SCP2 and the substrate 10. The third support pattern 343 may cover the connection region CNR. The third support pattern 343 may be formed of carbon-doped polysilicon. A third insulation pattern 350c may be between the third support pattern 343 and the second source conductive pattern SCP2. The first, second, and third insulation patterns 350a, 350b, and 350c may be formed of an insulating material, such as a silicon oxide layer, a silicon nitride layer, or a silicon oxynitride layer.

On the connection region CNR, a plurality of second dummy vertical semiconductor patterns DVS2 may penetrate the electrode structure ST, the second source conductive pattern SCP2, the third insulation pattern 350c, and the third support pattern 343, and may extend into the substrate 10. A second dummy data storage pattern DSPd2 may be between the second dummy vertical semiconductor patterns DVS2 and the third support pattern 343 and between the second dummy vertical semiconductor patterns DVS2 and the second source conductive pattern SCP2. On the connection region CNR, the second dummy vertical semiconductor patterns DVS2 may penetrate the pad portions of the gate electrodes EGE, GGE, CGE, and SGE. The second dummy vertical semiconductor patterns DVS2 may have widths greater than those of the cell vertical semiconductor patterns VS and those of the first dummy vertical semiconductor patterns DVS1.

The cell data storage pattern DSP may have a macaroni shape or a pipe shape. The cell data storage pattern DSP may include a tunnel insulation layer TIL, a charge storage layer CIL, and a blocking insulation layer BLK. The cell data storage pattern DSP may not be between the first source conductive pattern SCP1 and the cell vertical semiconductor pattern VS. The cell vertical semiconductor pattern VS may contact the first source conductive pattern SCP1. The cell data storage pattern DSP may have a bottom end higher than a bottom surface of the second source conductive pattern SCP2. The cell vertical semiconductor pattern VS and the substrate 10 may be provided therebetween with a residual cell data storage pattern DSPr below the first source conductive pattern SCP1. The residual cell data storage pattern DSPr may include a residual tunnel insulation layer TILr, a residual charge storage layer CILr, and a residual blocking insulation layer BLKr. The residual cell data storage pattern DSPr may have a top end lower than a bottom surface of the first support pattern 341.

Each of the first and second dummy data storage patterns DSPd1 and DSPd2 may have a substantially U-shaped cross section. The first and second dummy vertical semiconductor patterns DVS1 and DVS2 may be insulated from the source structure SC. The first dummy vertical semiconductor pattern DVS1 may be insulated through the first dummy data storage pattern DSPd1 from the first and second source conductive patterns SCP1 and SCP2. The second dummy vertical semiconductor pattern DVS2 may be insulated through the second dummy data storage pattern DSPd2 from the first and second source conductive patterns SCP1 and SCP2. Each of the first and second dummy data storage patterns DSPd1 and DSPd2 may include a dummy tunnel insulation layer TILd, a dummy charge storage layer CILd, and a dummy blocking insulation layer BLKd.

The first and second dummy vertical semiconductor patterns DVS1 and DVS2 may be floated without being supplied with voltages during device operation. When at least one of the first and second dummy vertical semiconductor patterns DVS1 and DVS2 are in contact with the source structure SC, a leakage current may occur from the at least one of the first and second dummy vertical semiconductor patterns DVS1 and DVS2 to the source structure SC. This leakage current may give rise to problems during device operation. However, according to some embodiments of the inventive concepts, since the first and second dummy vertical semiconductor patterns DVS1 and DVS2 may be insulated from the source structure SC, the first and second dummy vertical semiconductor patterns DVS1 and DVS2 may be satisfactorily floated during device operation and a leakage current path may be substantially prevented.

The tunnel insulation layer TIL, the residual tunnel insulation layer TILr, and the dummy tunnel insulation layer TILd may be or include, for example, a silicon oxide layer. The blocking insulation layer BLK, the residual blocking insulation layer BLKr, and the dummy blocking insulation layer BLKd may be or include a high-k dielectric layer, such as an aluminum oxide layer or a hafnium oxide layer. The charge storage layer CIL, the residual charge storage layer CILr, and the dummy charge storage layer CILd may be or include at least one of a silicon nitride layer, a silicon oxynitride layer, a silicon-rich nitride layer, a nano-crystalline silicon layer, and a laminated trap layer.

The first source conductive pattern SCP1 may include an upper extension SCP1$u$ extending between the cell vertical semiconductor pattern VS and the second source conductive pattern SCP2, a lower extension SCP1$b$ extending between the cell vertical semiconductor pattern VS and the substrate 10, and a side extension SCP1$s$ extending either between the first support pattern 341 and the second source conductive pattern SCP2 or between the second support pattern 342 and the second source conductive pattern SCP2. The upper, lower, and side extensions SCP1$u$, SCP1$b$, and SCP1$s$ may have rounded surfaces.

The cell vertical semiconductor patterns VS and the first and second dummy vertical semiconductor patterns DVS1 and DVS2 may have hollow cup shapes. A buried insulation pattern VI may be in each of the cell vertical semiconductor pattern VS, the first dummy vertical semiconductor pattern DVS1, and the second dummy vertical semiconductor pattern DVS2. The buried insulation pattern VI may be formed of, for example, a silicon oxide layer.

The substrate 10 may be provided thereon with a planarized insulation layer 110 that covers ends of the electrode structure ST on the connection region CNR. The planarized insulation layer 110 may have a substantially flat top surface. The planarized insulation layer 110 may include a single insulation layer or a plurality of stacked insulation layers, such as a silicon oxide layer and/or a low-k dielectric layer. The second dummy vertical semiconductor patterns DVS2 may penetrate the planarized insulation layer 110.

The cell vertical semiconductor patterns VS and the first and second dummy vertical semiconductor patterns DVS1 and DVS2 may include a semiconductor material, such as silicon (Si), germanium (Ge), or a mixture thereof. The cell vertical semiconductor patterns VS and the first and second dummy vertical semiconductor patterns DVS1 and DVS2 may be or may include an impurity-doped semiconductor or an impurity-undoped intrinsic semiconductor. The cell vertical semiconductor patterns VS and the first and second dummy vertical semiconductor patterns DVS1 and DVS2 may include a polycrystalline semiconductor material.

The cell vertical semiconductor patterns VS including a semiconductor material may be used as channels of the erase control transistor ECT, the string and ground select transistors SST and GST, and the memory cell transistors MCT, which transistors ECT, SST, GST, and MCT are discussed with reference to FIG. 2. A bit line conductive pad BLPAD may be provided on each of upper portions of the cell vertical semiconductor patterns VS, the first dummy vertical semiconductor patterns DVS1, and the second dummy vertical semiconductor patterns DVS2. The bit line conductive pad BLPAD may be an impurity-doped region or formed of a conductive material. The bit line conductive pads BLPAD on the cell vertical semiconductor patterns VS may be connected to the bit line BL. The bit line conductive pads BLPAD on the first and second dummy vertical semiconductor patterns DVS1 and DVS2 may not be connected to the bit line BL.

A horizontal insulation pattern HL may be between the data storage patterns DSP, DSPd1, and DSPd2 and sidewalls of the gate electrodes EGE, GGE, CGE, and SGE, as illustrated, for example, in FIG. 6A. The horizontal insulation pattern HL may extend onto top and bottom surfaces of the gate electrodes EGE, GGE, CGE, and SGE from the sidewalls of the gate electrodes EGE, GGE, CGE, and SGE. In some embodiments, the horizontal insulation pattern HL may include a charge storage layer and a tunnel insulation layer that serve as a portion of a data storage layer for an NAND Flash memory device. Alternatively, in some embodiments, the horizontal insulation pattern HL may include only a blocking insulation layer.

The planarized insulation layer 110 may be provided thereon with first and second interlayer dielectric layers 121 and 123 that are sequentially stacked and cover the electrode structure ST, the cell vertical semiconductor patterns VS, and the first and second dummy vertical semiconductor patterns DVS1 and DVS2. The bit lines BL on the second interlayer dielectric layer 123 may be electrically connected through bit line contact plugs BPLG to corresponding cell vertical semiconductor patterns VS.

The three-dimensional semiconductor memory device according to some embodiments of inventive concepts may exclude butting contact plugs through which the vertical semiconductor patterns VS, DVS1, and DVS2 are connected to the substrate 10. The butting contact plugs mainly formed by selective epitaxial growth may have a height distribution that causes deterioration of device performance. As high integration reduces widths of the vertical semiconductor patterns VS, DVS1, and DVS2, it may be increasingly difficult to connect the vertical semiconductor patterns VS, DVS1, and DVS2 to the butting contact plugs. According to the inventive concepts, the butting contact plugs may be excluded to avoid problems caused thereby. In addition, according to the inventive concepts, sidewalls of the cell vertical semiconductor patterns VS may contact the source structure SC, such that the device may operate more reliably than in case the butting contact plugs are provided.

FIGS. 7A to 7J illustrate cross-sectional views illustrating operations of methods of fabricating three-dimensional semiconductor memory devices having the cross-section of FIG. 4.

Figure 7A:
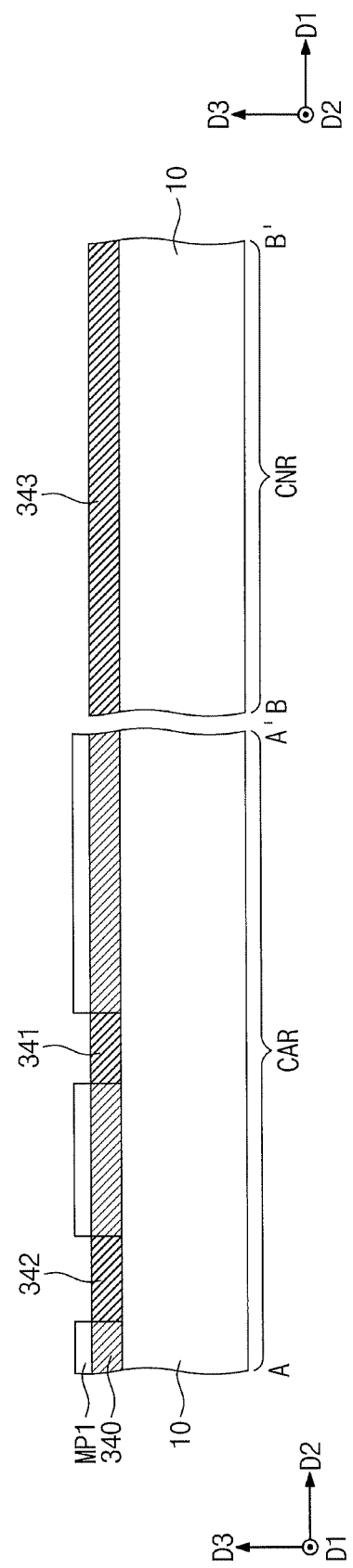

Referring to FIG. 7A, a substrate 10 may be prepared to include a cell array region CAR and a connection region CNR. A first semiconductor layer 340 may be formed on an entire surface of the substrate 10. The first semiconductor layer 340 may be formed of, for example, an impurity-undoped polysilicon layer. The substrate 10 may be doped with impurities of a first conductivity type. A first mask layer MP1 may be formed on the first semiconductor layer 340. The first mask layer MP1 may have openings that limit positions of first and second support patterns 341 and 342 on the cell array region CAR. The first mask layer MP1 may expose the connection region CNR. The first mask layer MP1 may be formed of a material exhibiting an etch selectivity to the first semiconductor layer 340, which material may include at least one of a silicon oxide layer, a silicon nitride layer, a silicon oxynitride layer, a photoresist layer, an amorphous carbon layer (ACL), and a spin-on-hardmask (SOH) layer. The first mask layer MP1 may be used a mask to perform an ion implantation process to partially dope carbon into the first semiconductor layer 340. First, second, and third support patterns 341, 342, and 343 may thus be formed.

Referring to FIG. 7B, the first mask layer MP1 may be removed. An etch stop layer 350 and a second semiconductor layer 360 may be sequentially stacked on the first semiconductor layer 340 and the first, second, and third support patterns 341, 342, and 343. The etch stop layer 350 may be formed of a single layer or a plurality of layers including, for example, at least one of a silicon oxide layer and a silicon nitride layer. The second semiconductor layer 360 may be formed of an impurity-doped polysilicon layer or an impurity-undoped polysilicon layer. Gate interlayer dielectric layers 12 and sacrificial layers 22 may be alternately stacked on the second semiconductor layer 360, and thus a mold structure 100 may be formed. The gate interlayer dielectric layers 12 may be formed of, for example, a silicon oxide layer. The sacrificial layers 22 may be formed of, for example, a silicon nitride layer. An etching process may be performed several times such that the mold structure 100 may be formed to have a stepwise structure at an end thereof. A planarized insulation layer 110 may be formed on the entire surface of the substrate 10, and then a chemical mechanical polishing (CMP) process may be performed to leave the planarized insulation layer 110 on the connection region CNR.

Figure 7C:
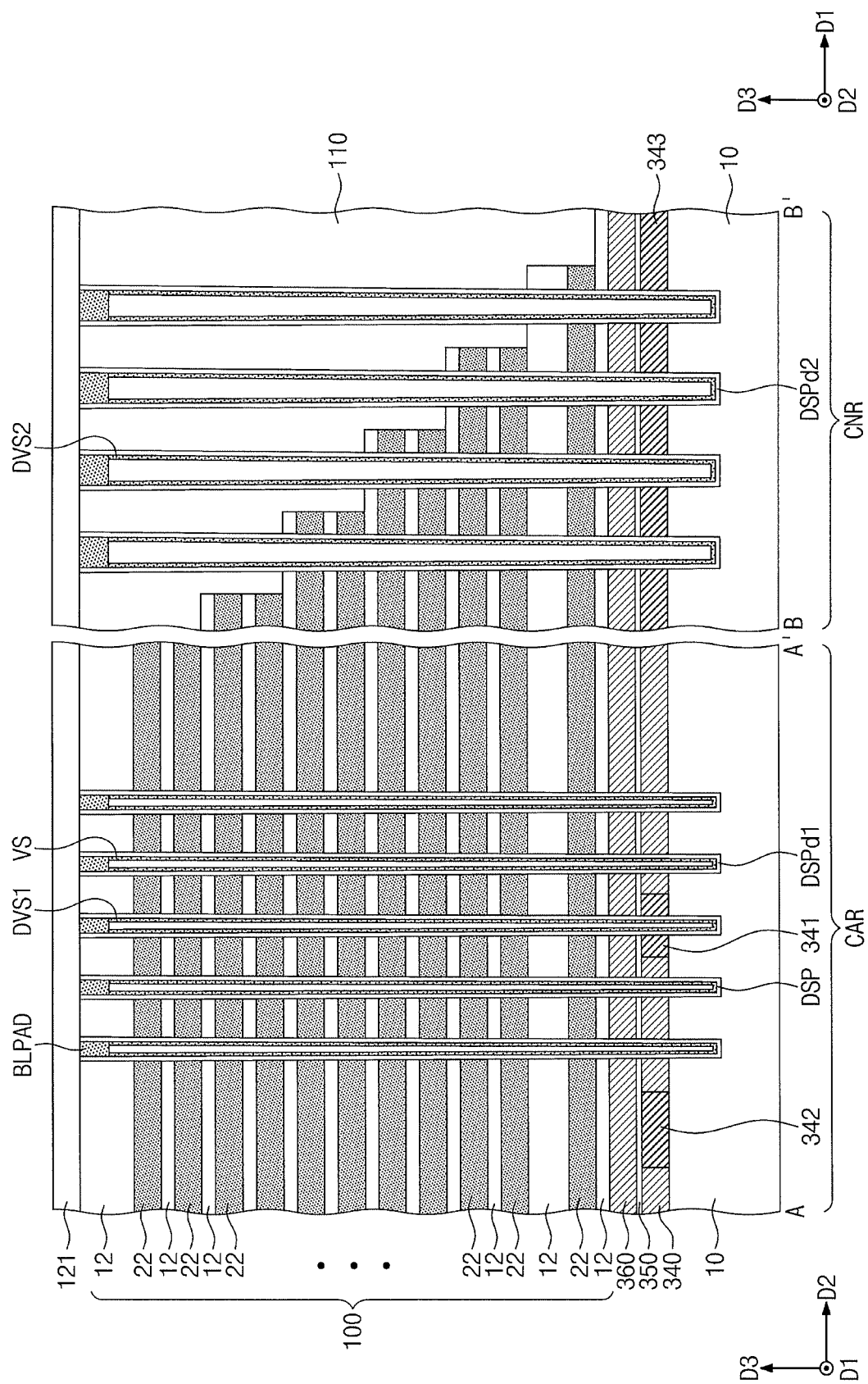

Referring to FIG. 7C, on the cell array region CAR, cell vertical semiconductor patterns VS may be formed to penetrate the mold structure 100, the second semiconductor layer 360, the etch stop layer 350, the first semiconductor layer 340, and a portion of the substrate 10, and cell data storage patterns DSP may be formed to surround sidewalls of the cell vertical semiconductor patterns VS. At the same time, first dummy vertical semiconductor patterns DVS1 may be formed to penetrate the mold structure 100, the second semiconductor layer 360, the etch stop layer 350, the first support pattern 341, and a portion of the substrate 10, and first dummy data storage patterns DSPd1 may be formed to surround sidewalls of the first dummy vertical semiconductor patterns DVS1. At the same time, on the connection region CNR, second dummy vertical semiconductor patterns DVS2 may be formed to penetrate the planarized insulation layer 110, the end of the mold structure 100, the second semiconductor layer 360, the etch stop layer 350, the third support pattern 343, and a portion of the substrate 10, and second dummy data storage patterns DSPd2 may be formed to surround sidewalls of the second dummy vertical semiconductor patterns DVS2. The first support pattern 341 may separate the first dummy data storage pattern DSPd1 from the first semiconductor layer 340. A bit line conductive pad BLPAD may be formed on each of upper portions of the cell vertical semiconductor patterns VS, the first dummy vertical semiconductor patterns DVS1, and the second dummy vertical semiconductor patterns DVS2. A first interlayer dielectric layer 121 may be formed on the mold structure 100 and the planarized insulation layer 110.

Figure 7D:
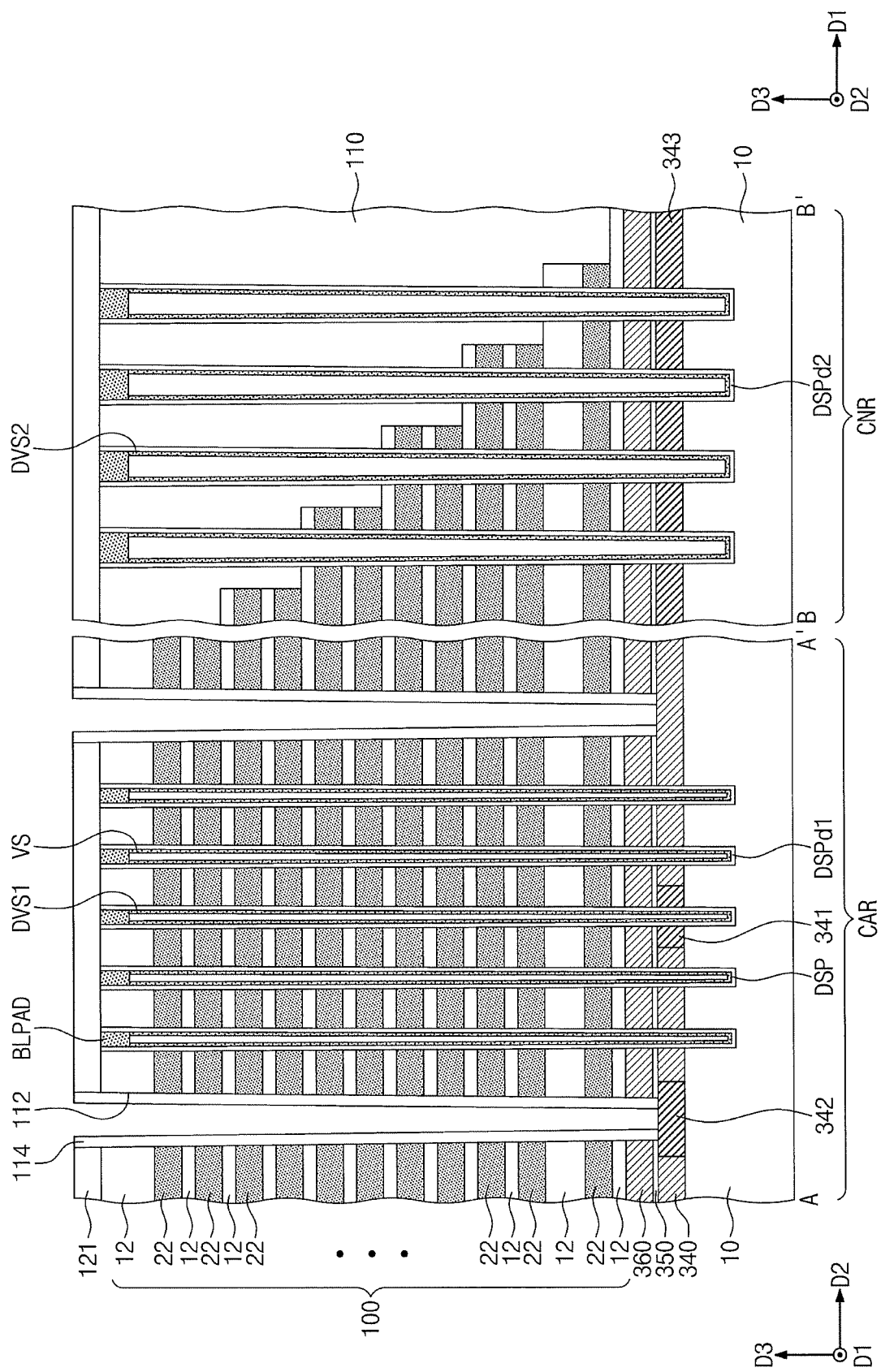

Referring to FIG. 7D, on the cell array region CAR, the first interlayer dielectric layer 121, the mold structure 100, the second semiconductor layer 360, and the etch stop layer 350 may be etched to form first grooves 112 expose the first semiconductor layer 340 and the second support pattern 342. A sacrificial spacer 114 may be formed to cover a sidewall of the first groove 112. The sacrificial spacer 114 may be formed of a single layer or a plurality of layers including, for example, at least one of a silicon oxide layer and a silicon nitride layer.

Figure 7E:
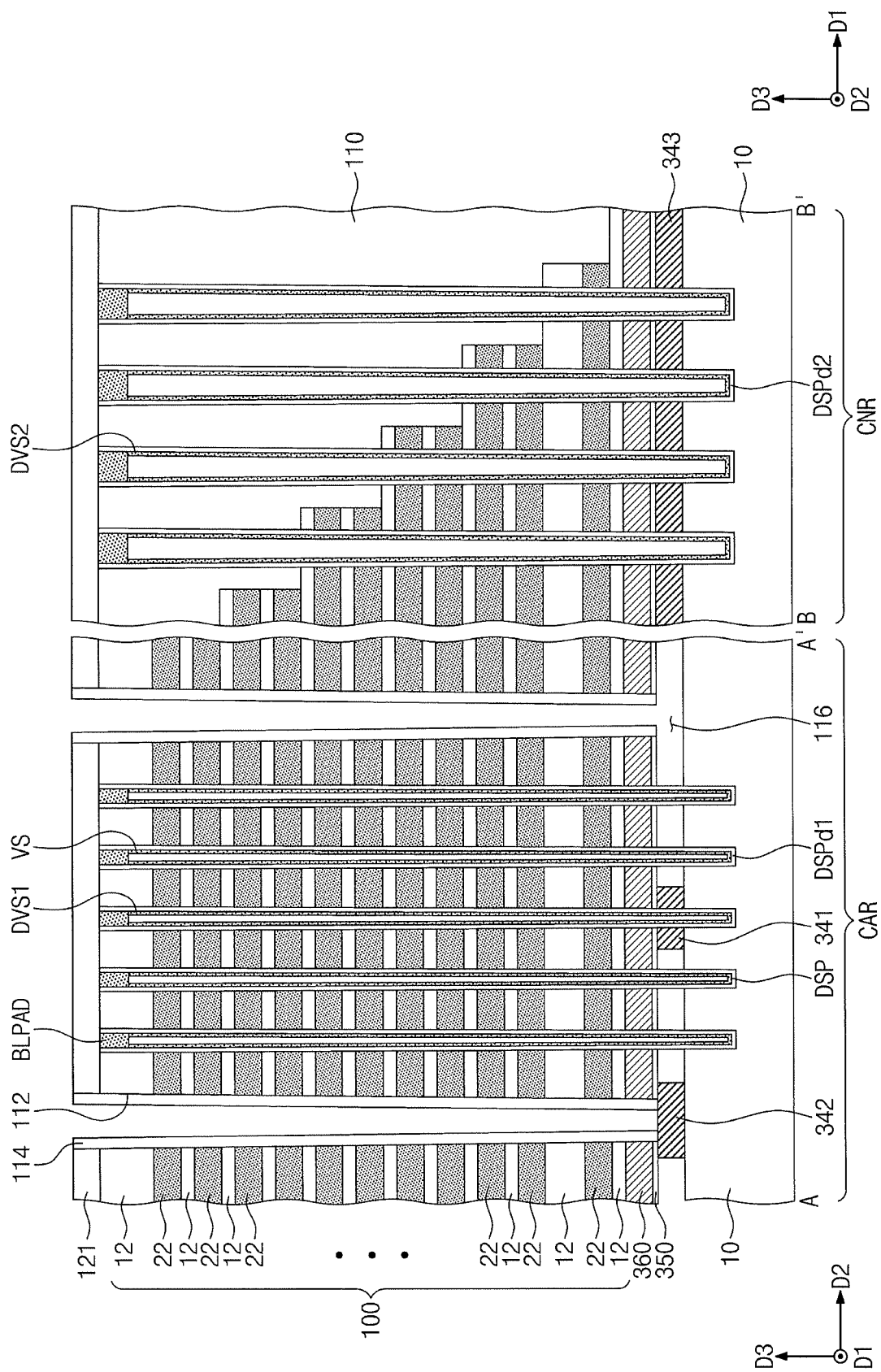

Referring to FIG. 7E, the first semiconductor layer 340 exposed to the first groove 112 may be removed to form a first empty space 116. The first semiconductor layer 340 may be removed by, for example, an isotropic etching process. When the first semiconductor layer 340 is removed, the first, second, and third support patterns 341, 342, and 343 may not be removed due to carbon doped therein. The first empty space 116 may expose sidewall of the first, second, and third support patterns 341, 342, and 343, a bottom surface of the etch stop layer 350, a top surface of the substrate 10, and lower sidewalls of the cell data storage patterns DSP. In contrast, sidewalls of the first and second dummy data storage patterns DSPd1 and DSPd2 may not be exposed but covered with the first and third support patterns 341 and 343. In the operations illustrated in FIG. 7E, the first, second, and third support patterns 341, 342, and 343 may prevent collapse of the mold structure 100. In particular, the anti-collapse may be enhanced by the second and third support patterns 342 and 343 as compared with the case where only the first support pattern 341 is present.

Figure 7F:
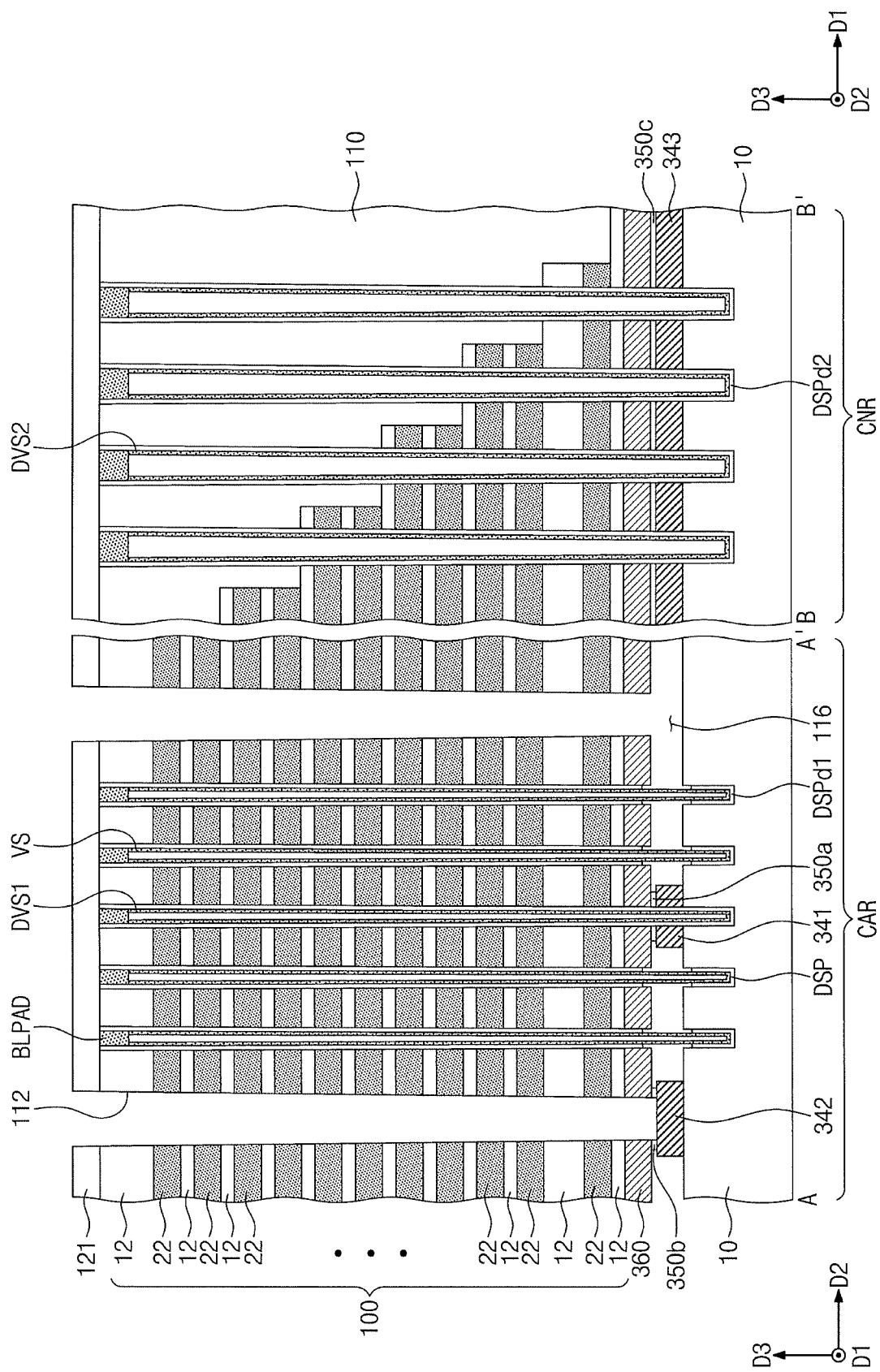

Referring to FIGS. 7E and 7F, the sacrificial spacer 114 may be removed to expose a sidewall of the first groove 112. An isotropic etching process may be used to remove the sacrificial spacer 114. A portion of the etch stop layer 350 may also be removed to partially expose bottom and lateral surfaces of the second semiconductor layer 360 and to form first, second, and third insulation patterns 350a, 350b, and 350c. In addition, the cell data storage pattern DSP may also be partially removed to expose sidewalls of the cell vertical semiconductor patterns VS. The cell data storage pattern DSP may be completely removed on its portion located at a height the same as that at which the first, second, and third support patterns 341, 342, and 343 are located, such that a residual cell data storage pattern DSPr may remain below the top surface of the substrate 10. The substrate 10 may also be partially exposed on its upper sidewall. In this operation, the second semiconductor layer 360 may serve as an etch stop layer to prevent etching of a lowermost one of the gate interlayer dielectric layers 12.

Figure 7G:
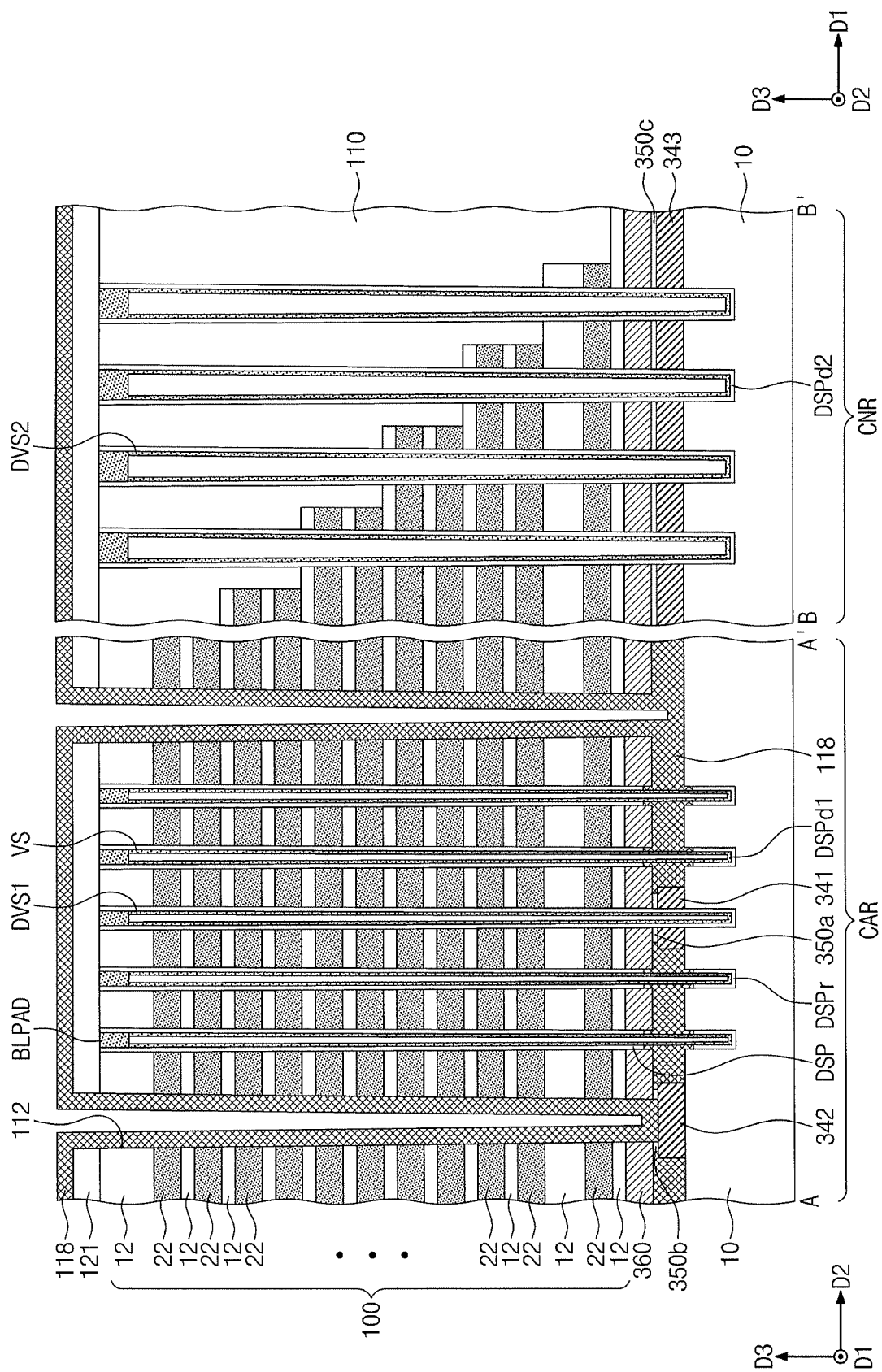

Referring to FIGS. 7F and 7G, a third semiconductor layer 118 may be conformally formed on the entire surface of the substrate 10. The third semiconductor layer 118 may be or include, for example, a polysilicon layer doped with impurities of a second conductivity type opposite to the first conductivity type of the substrate 10. The third semiconductor layer 118 may fill the first empty space 116. In some embodiments, an air gap or seam may be formed in the third semiconductor layer 118. The third semiconductor layer 118 may be conformally formed on the sidewall of the first groove 112 and on the first interlayer dielectric layer 121.

Figure 7H:
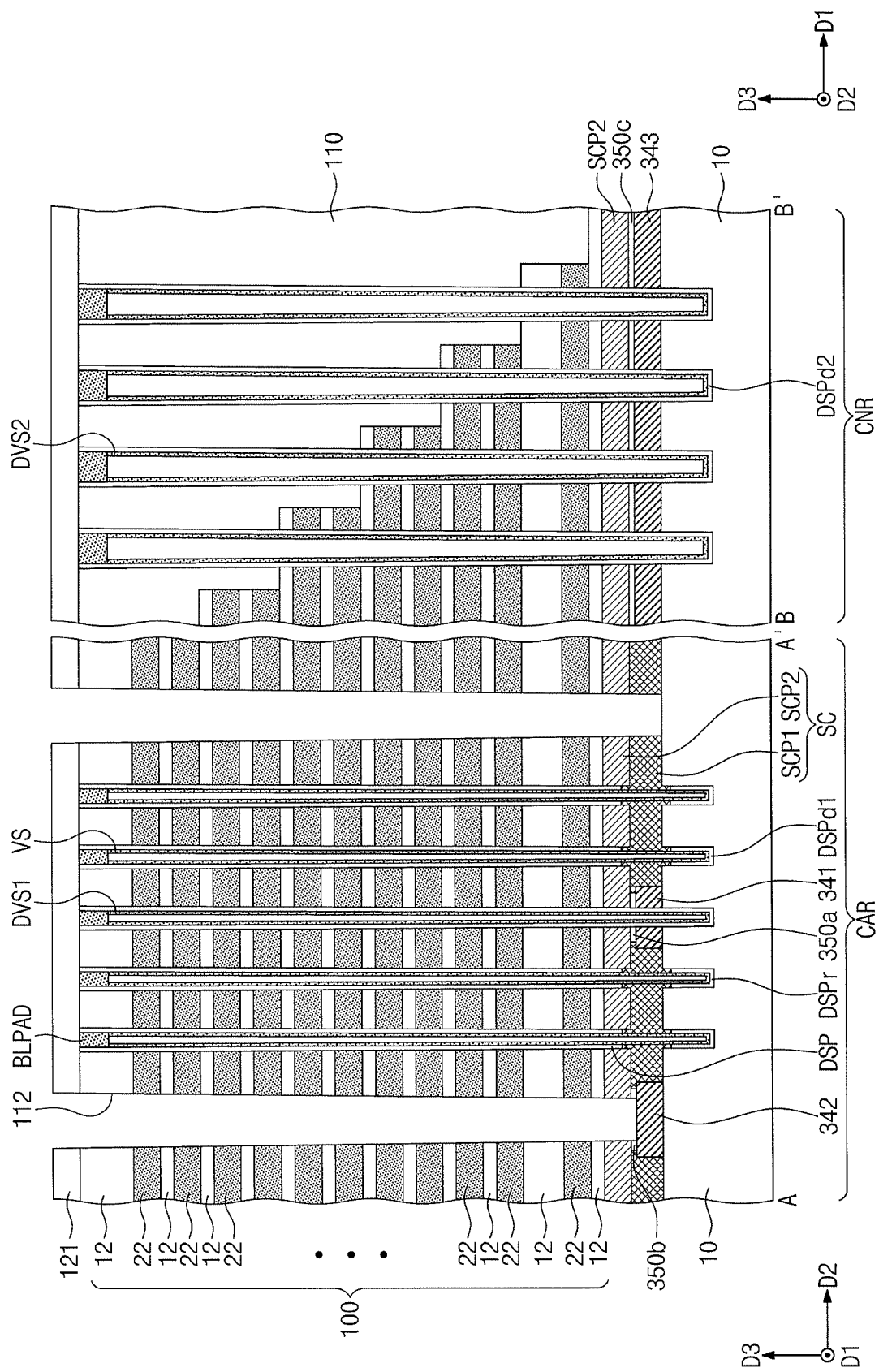

Referring to FIGS. 7G and 7H, the third semiconductor layer 118 may be removed from the sidewall and a floor surface of the first groove 112 and from the first interlayer dielectric layer 121. The removal of the third semiconductor layer 118 may expose a top surface of the second support pattern 342 on the floor surface of the first groove 112, the top surface of the substrate 10 on the floor surface of the first groove 112, the sidewall of the first groove 112, and a top surface of the first interlayer dielectric layer 121.

Figure 7I:
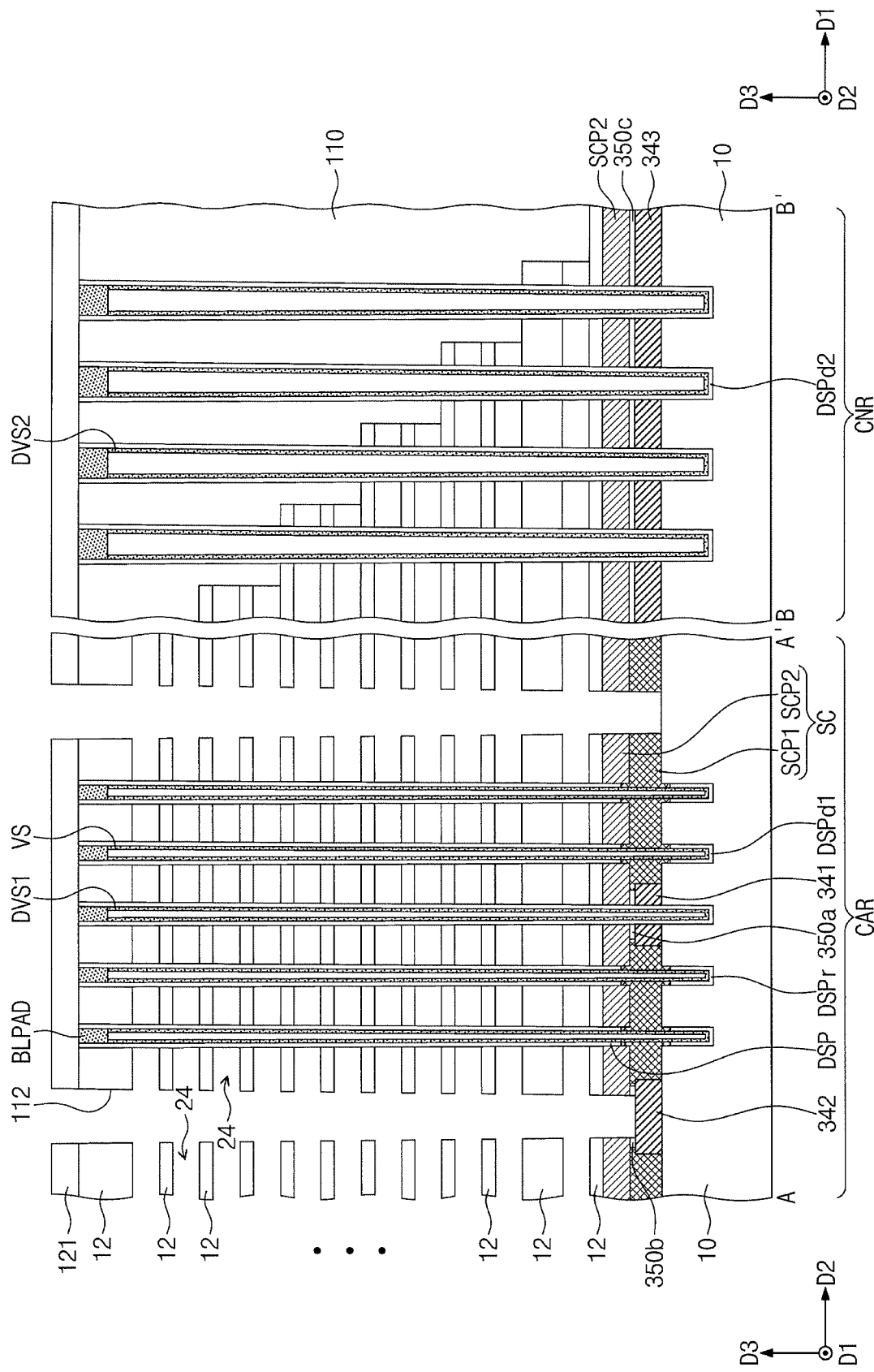

Referring to FIGS. 7H and 7I, a removal process may be performed on the sacrificial layers 22 exposed on the sidewall of the first groove 112, and thus second empty spaces 24 may be formed between the gate interlayer dielectric layers 12. The second empty spaces 24 may expose top and bottom surfaces of the gate interlayer dielectric layers 12. On the connection region CNR, the second empty space 24 may expose a sidewall of the planarized insulation layer 110. The cell vertical semiconductor patterns VS and the first and second dummy vertical semiconductor patterns DVS1 and DVS2 may prevent collapse of the gate interlayer dielectric layers 12.

Figure 7J:
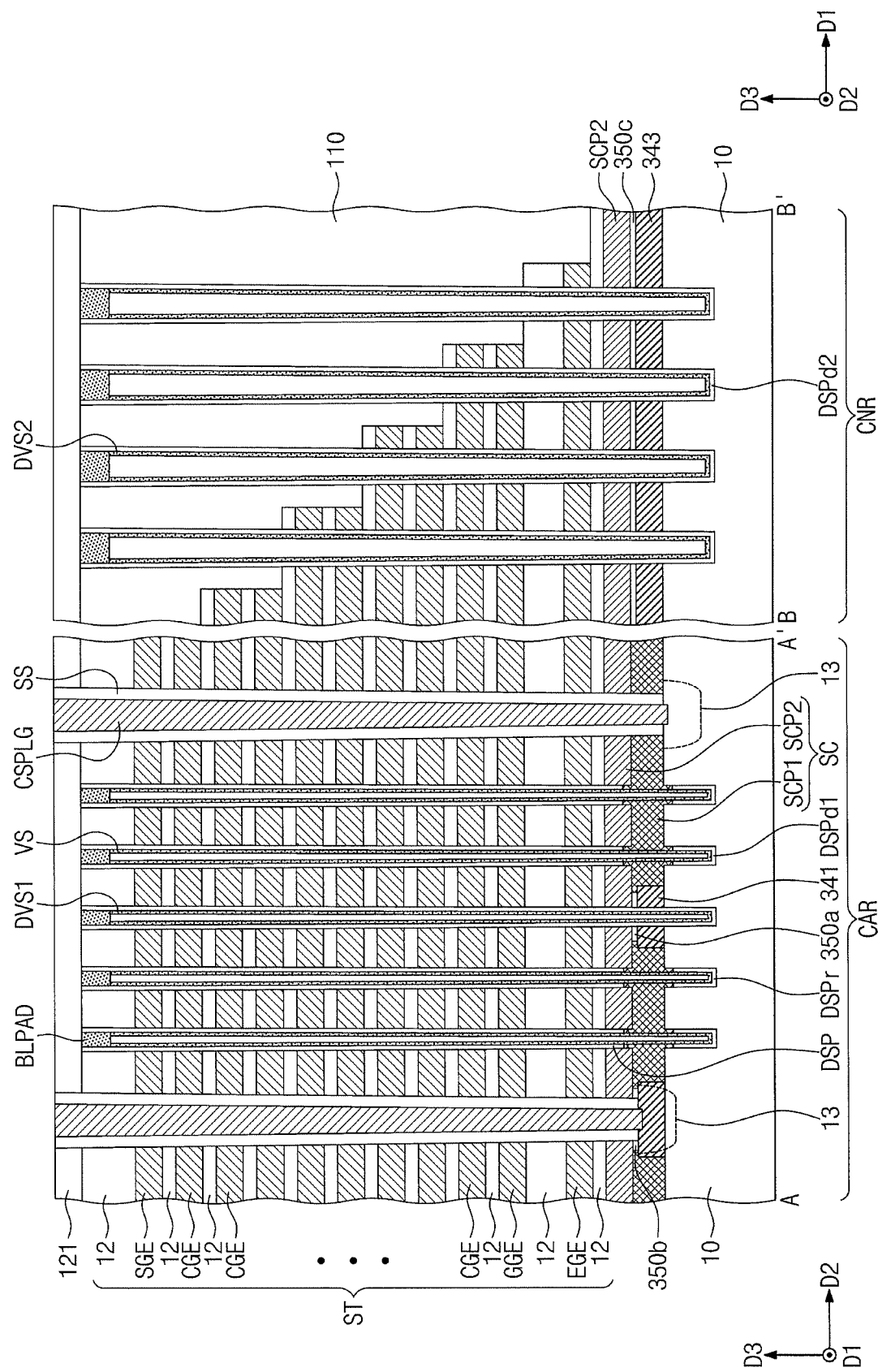

Referring to FIGS. 7I, 7J, and 6A, a horizontal insulation layer may be conformally formed on the entire surface of the substrate 10. A conductive layer may be deposited to fill the second empty spaces 24 and the first groove 112. An etching process may be performed to remove the horizontal insulation layer and the conductive layer from the first groove 112, and thus on the floor surface of the first groove 112, the second support pattern 342 and the top surface of the substrate 10 may be exposed. Accordingly, horizontal insulation patterns HL and gate electrodes EGE, GGE, CGE, and SGE may be formed. An ion implantation process may be performed to form an impurity-doped region 13 in the substrate 10 and the second support pattern 342 that are exposed on the floor surface of the first groove 112. An insulation spacer SS may be formed on the sidewall of the first groove 112, and a conductive layer may be deposited and etched to form a source contact plug CSPLG filling the first groove 112.

Subsequently, referring to FIG. 4, a second insulation layer 113, bit line contact plugs BPLG, and bit lines BL may be formed.

Figure 8:
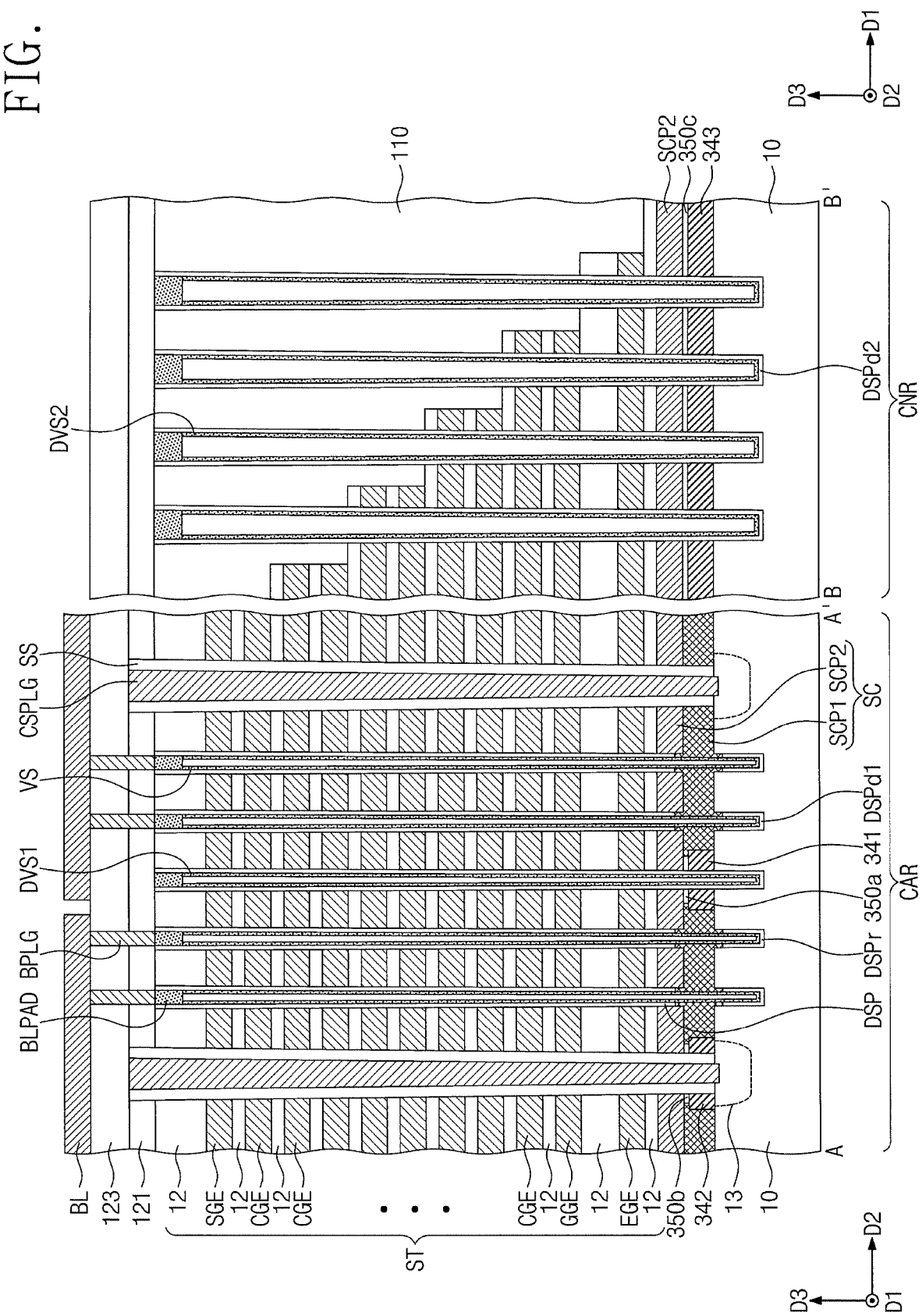
FIG. 8 is a cross-sectional view taken along lines A-A' and B-B' of FIG. 3, according to some embodiments of inventive concepts.

FIG. 8 is a cross-sectional view taken along lines A-A' and B-B' of FIG. 3, according to some embodiments of inventive concepts.

Referring to FIG. 8, a three-dimensional semiconductor memory device according to some embodiments may be configured such that the source contact plug CSPLG may penetrate the second support pattern 342 and contact the substrate 10. For example, the second support pattern 342 may be between the source contact plug CSPLG and the first source conductive pattern SCP1. Unlike that shown in FIG. 6B, the source contact plug CSPLG illustrated in FIG. 8 may have a bottom surface whose height is constant regardless of the position of the bottom surface. The impurity-doped region 13 may not be formed in the second support pattern 342 but in the substrate 10. The impurity-doped region 13 may have a height that is constant regardless of the position thereof.

The following describes methods of fabricating the three-dimensional semiconductor memory device of FIG. 8. In the operations discussed with reference to FIGS. 7I and 7J, after the horizontal insulation layer and the conductive layer are removed from the first groove 112, the second support pattern 342 exposed on the floor surface of the first groove 112 may be additionally etched to expose the top surface of the substrate 10. The impurity-doped region 13 may be formed in the substrate 10 exposed on the floor surface of the first groove 112. Other subsequent processes may be identical or similar to those discussed with reference to FIGS. 7J and 4.

Figure 9:
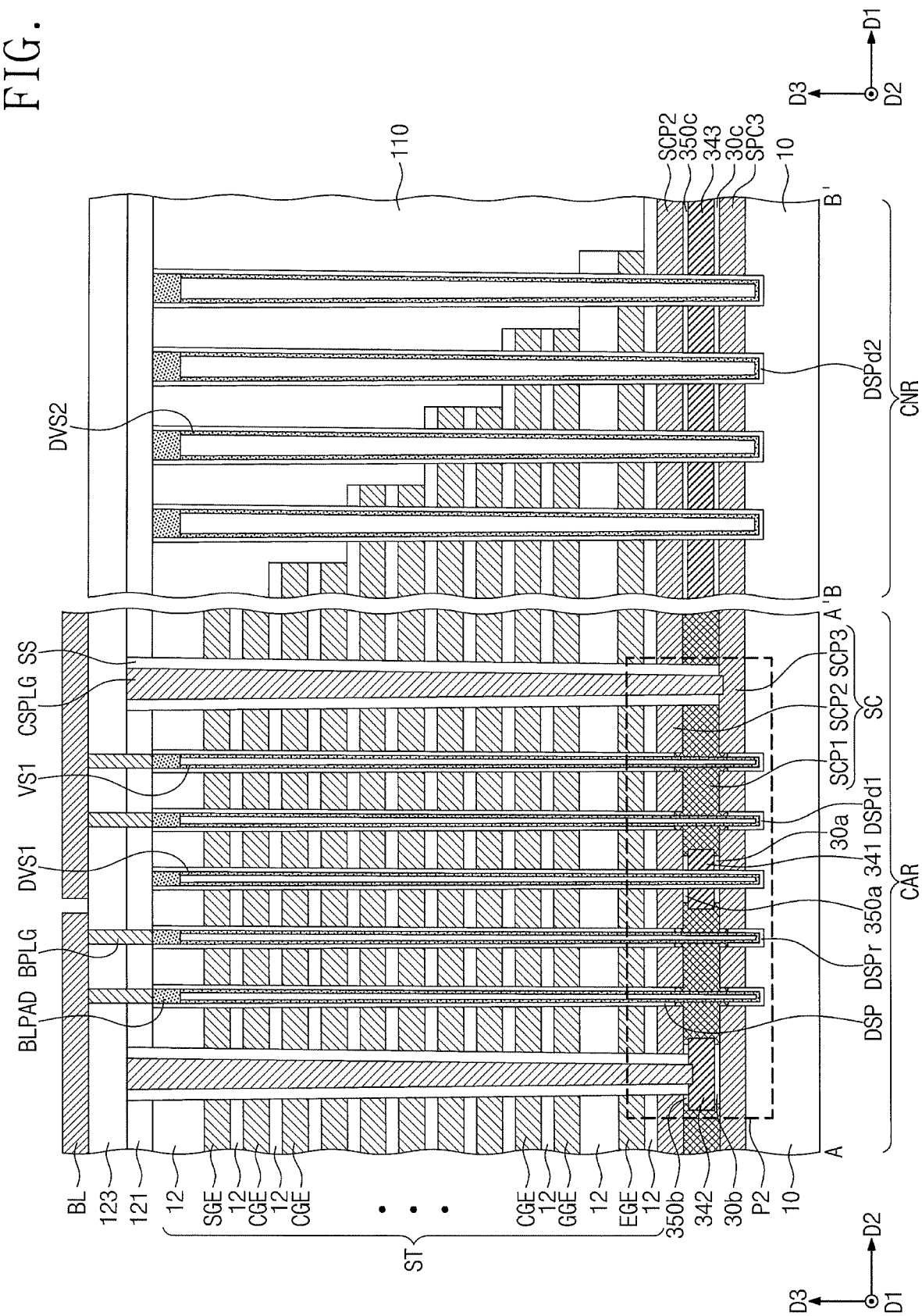
FIG. 9 is a cross-sectional view taken along lines A-A' and B-B' of FIG. 3, according to some embodiments of inventive concepts.
Figure 10:
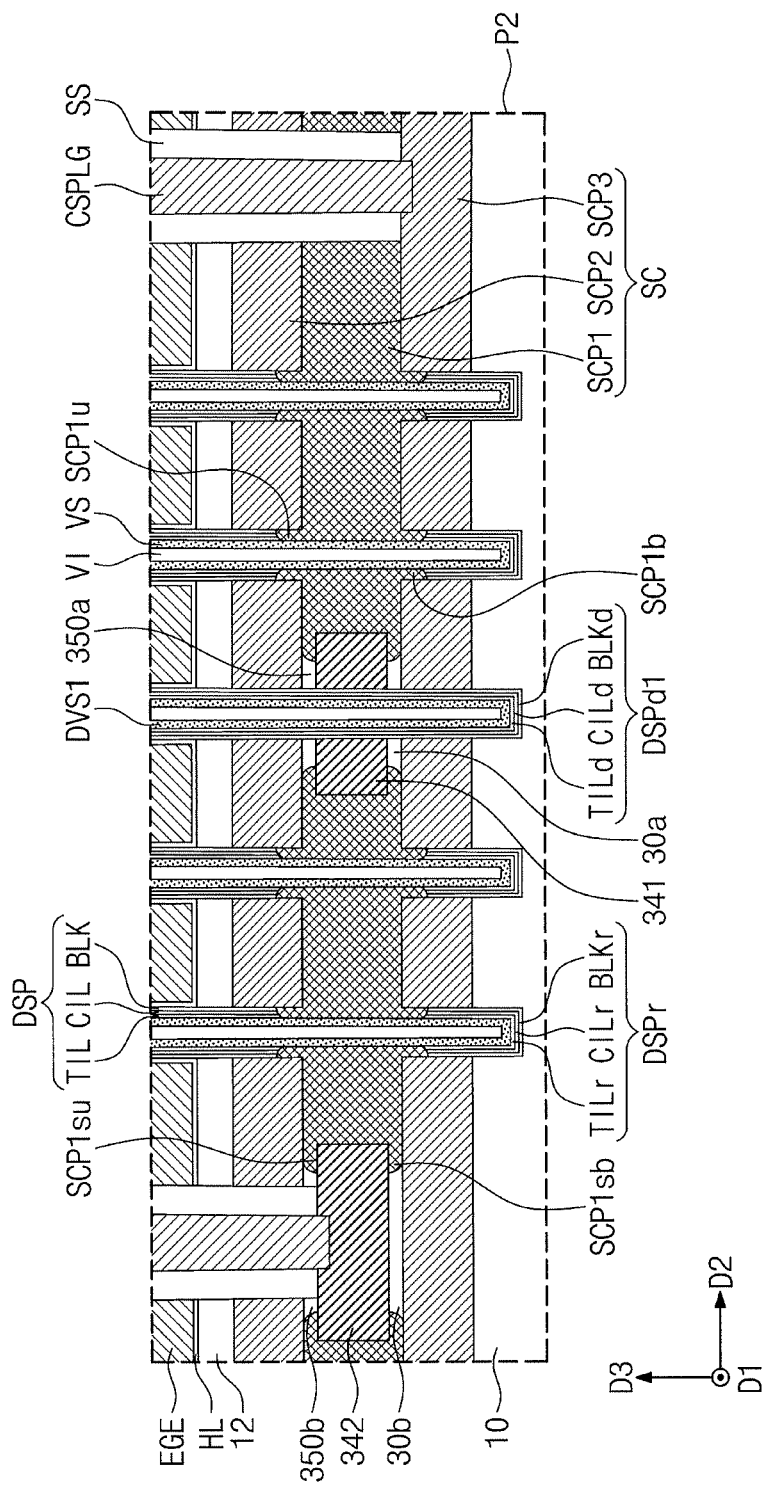
FIG. 10 is an enlarged view illustrating section P2 of FIG. 9.

FIG. 9 is a cross-sectional view taken along lines A-A' and B-B' of FIG. 3, according to some embodiments of inventive concepts. FIG. 10 is an enlarged cross-sectional view illustrating section P2 of FIG. 9.

Referring to FIGS. 9 and 10, a three-dimensional semiconductor memory device according to some embodiments may be configured such that the source structure SC may include the first and second source conductive patterns SCP1 and SCP2 and further include a third source conductive pattern SCP3 below the first source conductive pattern SCP1. The third source conductive pattern SCP3 may be formed of, for example, a polysilicon layer doped with impurities of the second conductivity type. The source contact plug CSPLG may contact the third source conductive pattern SCP3. The three-dimensional semiconductor memory device may exclude the impurity-doped region 13 of FIG. 4. A first auxiliary insulation pattern 30a may be between the first support pattern 341 and the third source conductive pattern SCP3. The sidewall of the first support pattern 341 may laterally protrude beyond an edge of the first auxiliary insulation pattern 30a. A second auxiliary insulation pattern 30b may be between the second support pattern 342 and the third source conductive pattern SCP3. The sidewall of the second support pattern 342 may laterally protrude beyond an edge of the second auxiliary insulation pattern 30b. The third source conductive pattern SCP3 may cover the entirety of the connection region CNR. On the connection region CNR, a third auxiliary insulation pattern 30c may be between the third source conductive pattern SCP3 and the third support pattern 343.

In some embodiments, the cell vertical semiconductor patterns VS and the first and second dummy vertical semiconductor patterns DVS1 and DVS2 may penetrate the third source conductive pattern SCP3 and extend into the substrate 10. The first and second dummy data storage patterns DSPd1 and DSPd2 may respectively separate the first and second dummy vertical semiconductor patterns DVS1 and DVS2 from the third source conductive pattern SCP3. The residual cell data storage pattern DSPr may have a top end lower than a top surface of the third source conductive pattern SCP3.

As illustrated in FIG. 10, the first source conductive pattern SCP1 may include top, bottom, upper lateral, and lower lateral extensions SCP1$u$, SCP1$b$, SCP1$su$, and SCP1$sb$. The top extension SCP1$u$ may extend between the cell vertical semiconductor pattern VS and the second source conductive pattern SCP2. The bottom extension SCP1$b$ may extend between the cell vertical semiconductor pattern VS and the third source conductive pattern SCP3. The upper lateral extension SCP1$su$ may extend either between the first support pattern 341 and the second source conductive pattern SCP2 or between the second support pattern 342 and the second source conductive pattern SCP2. The lower lateral extension SCP may extend either between the first support pattern 341 and the third source conductive pattern SCP3 or between the second support pattern 342 and the third source conductive pattern SCP3. The extensions SCP1$u$, SCP1$b$, SCP1$su$, and SCP may have rounded surfaces. Other configurations and operations may be identical or similar to those discussed with reference to FIGS. 1 to 5.

FIGS. 11A to 11E illustrate cross-sectional views illustrating operations of methods of fabricating three-dimensional semiconductor memory devices having the cross-section of FIG. 9.

Figure 11A:
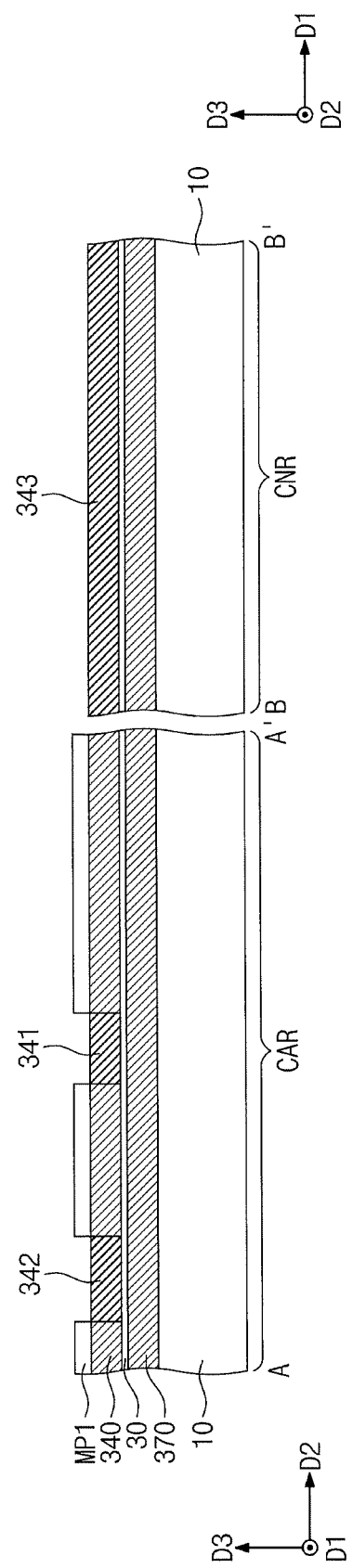

Referring to FIG. 11A, an auxiliary semiconductor layer 370 and an auxiliary etch stop layer 30 may be sequentially stacked on the substrate 10 including the cell array region CAR and the connection region CNR. The auxiliary semiconductor layer 370 may be formed of, for example, a polysilicon layer doped with impurities of the second conductivity type. The auxiliary etch stop layer 30 may be formed of a single layer or a plurality of layers including at least one of a silicon oxide layer and a silicon nitride layer. The first semiconductor layer 340 may be formed on the auxiliary etch stop layer 30. The first semiconductor layer 340 may be formed of, for example, an impurity-undoped polysilicon layer. The first mask layer MP1 may be formed on the first semiconductor layer 340. The first mask layer MP1 may be used a mask to perform an ion implantation process to partially dope carbon into the first semiconductor layer 340. Therefore, the first, second, and third support patterns 341, 342, and 343 may be formed.

Figure 11B:
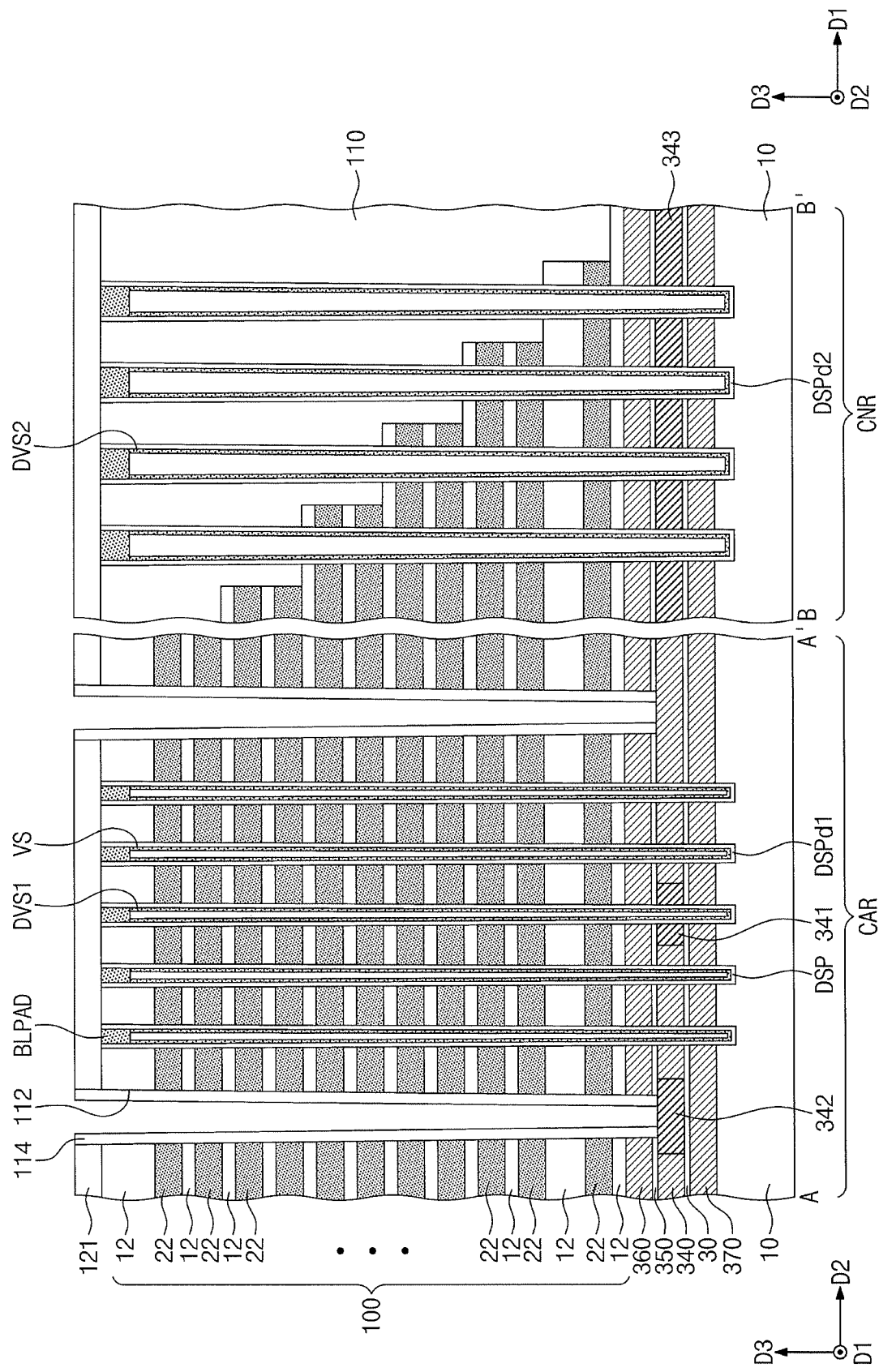

Referring to FIG. 11B, processes identical or similar to those discussed with reference to FIGS. 7B to 7D may be performed to form the mold structure 100, the planarized insulation layer 110, the cell vertical semiconductor patterns VS, the first and second dummy vertical semiconductor patterns DVS1 and DVS2, the cell data storage pattern DSP, the first and second dummy data storage patterns DSPd1 and DSPd2, the first interlayer dielectric layer 121, the first groove 112, and the sacrificial spacer 114.

Referring to FIG. 11C, the first semiconductor layer 340 exposed to the first groove 112 may be removed to form the first empty space 116. The first semiconductor layer 340 may be removed by, for example, an isotropic etching process. When the first semiconductor layer 340 is removed, the first, second, and third support patterns 341, 342, and 343 may not be removed due to carbon doped therein. The first empty space 116 may expose sidewall of the first, second, and third support patterns 341, 342, and 343, a bottom surface of the etch stop layer 350, a top surface of the auxiliary etch stop layer 30, and lower sidewalls of the cell data storage patterns DSP.

Figure 11D:
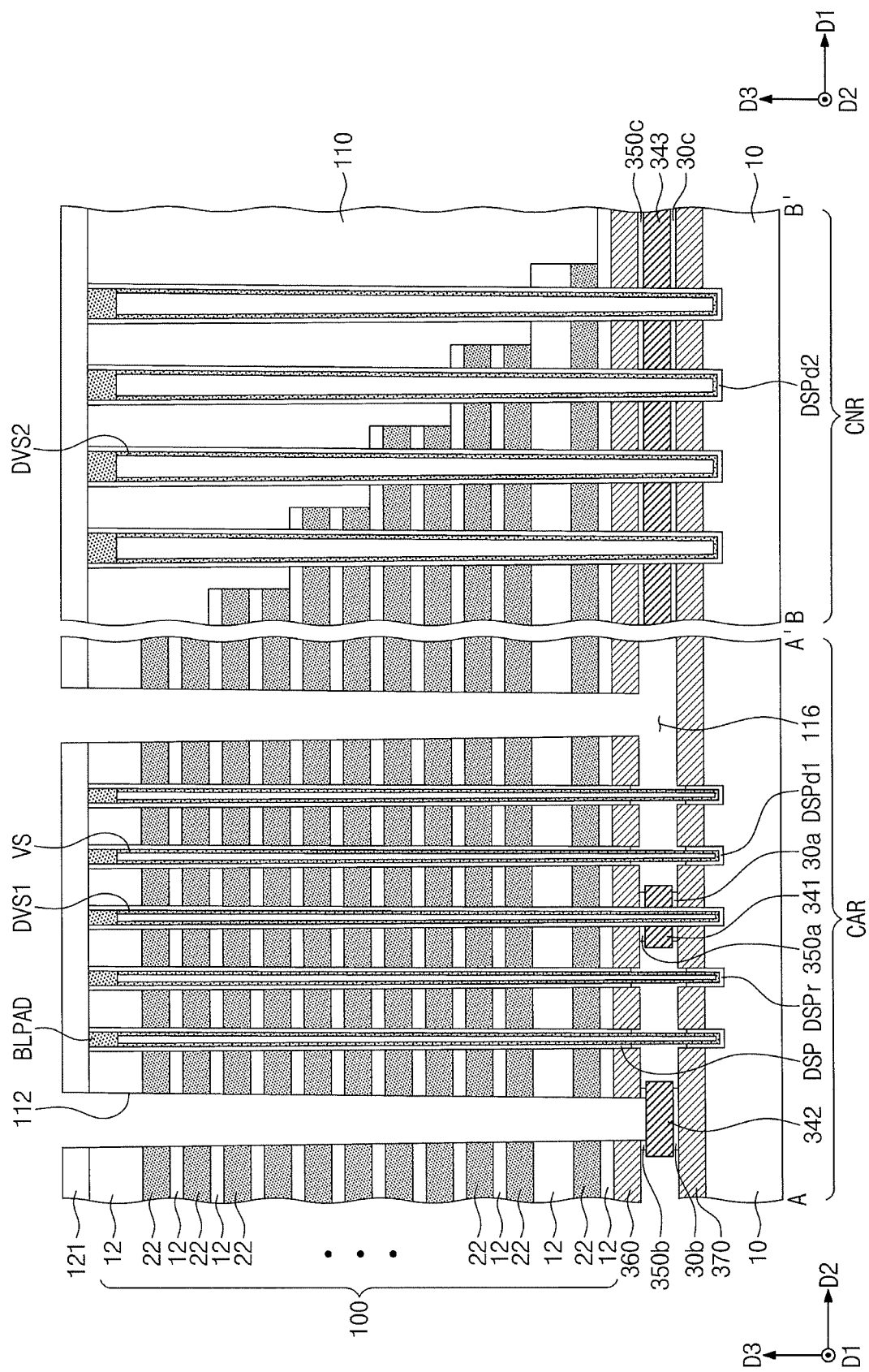

Referring to FIG. 11D, the sacrificial spacer 114 may be removed to expose a sidewall of the first groove 112. A portion of the etch stop layer 350 may also be removed to partially expose bottom and lateral surfaces of the second semiconductor layer 360 and to form the first, second, and third insulation patterns 350a, 350b, and 350c. A portion of the auxiliary etch stop layer 30 may also be removed to partially expose top and lateral surfaces of the auxiliary semiconductor layer 370 and to form first, second, and third auxiliary insulation patterns 30a, 30b, and 30c. In addition, the cell data storage pattern DSP may also be partially removed to expose sidewalls of the cell vertical semiconductor patterns VS. The cell data storage pattern DSP may be completely removed on its portion located at a height the same as that at which the first, second, and third support patterns 341, 342, and 343 are located, such that the residual cell data storage pattern DSPr may remain below the top surface of the substrate 10.

Figure 11E:
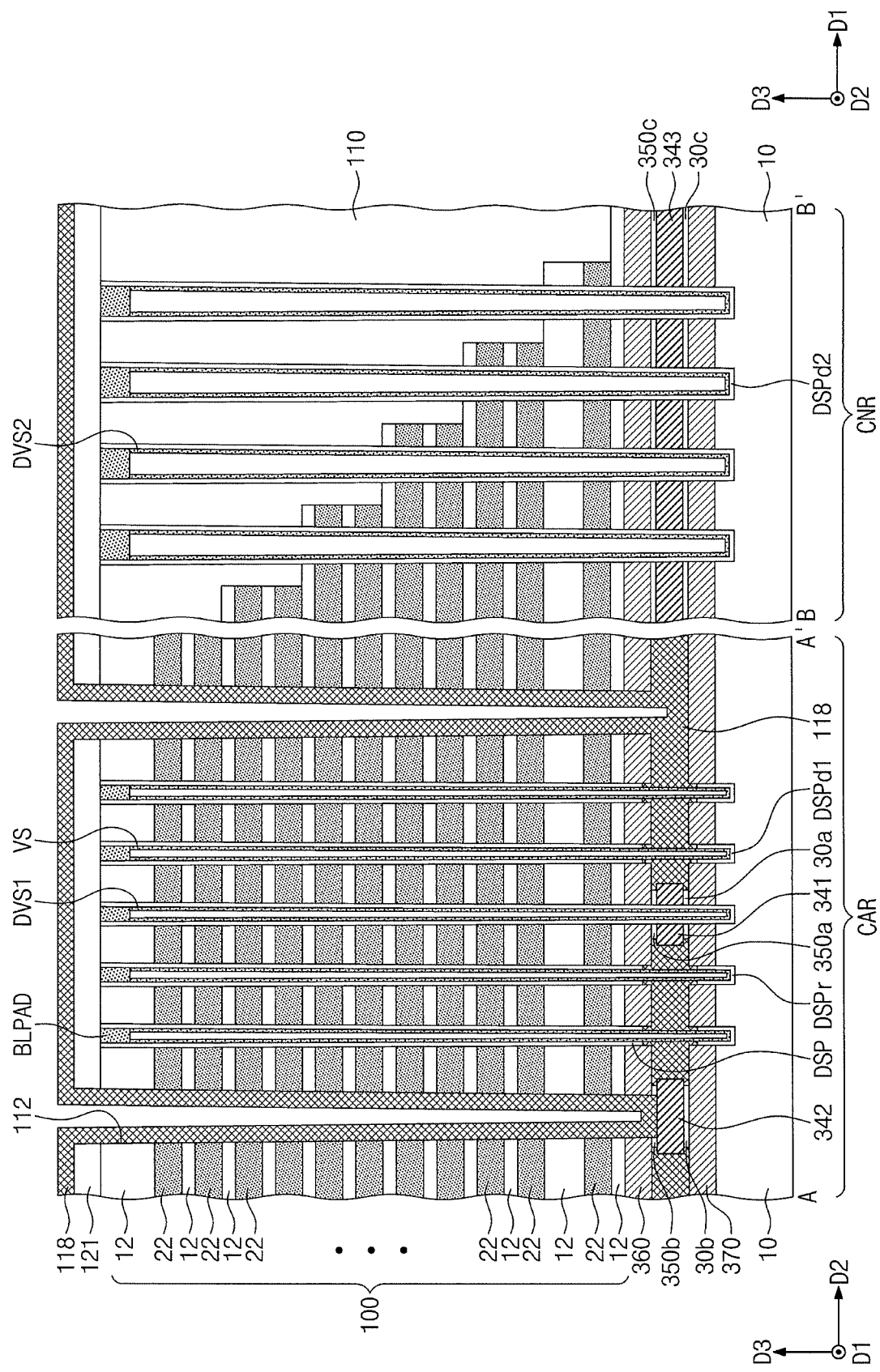

Referring to FIG. 11E, the third semiconductor layer 118 may be conformally formed on the entire surface of the substrate 10. The third semiconductor layer 118 may be or include, for example, a polysilicon layer doped with impurities of the second conductivity type. The third semiconductor layer 118 may fill the first empty space 116. The processes discussed with reference to FIGS. 7G to 7J and 4 may be subsequently performed. The impurity-doped region 13 may not be formed.

Figure 12:
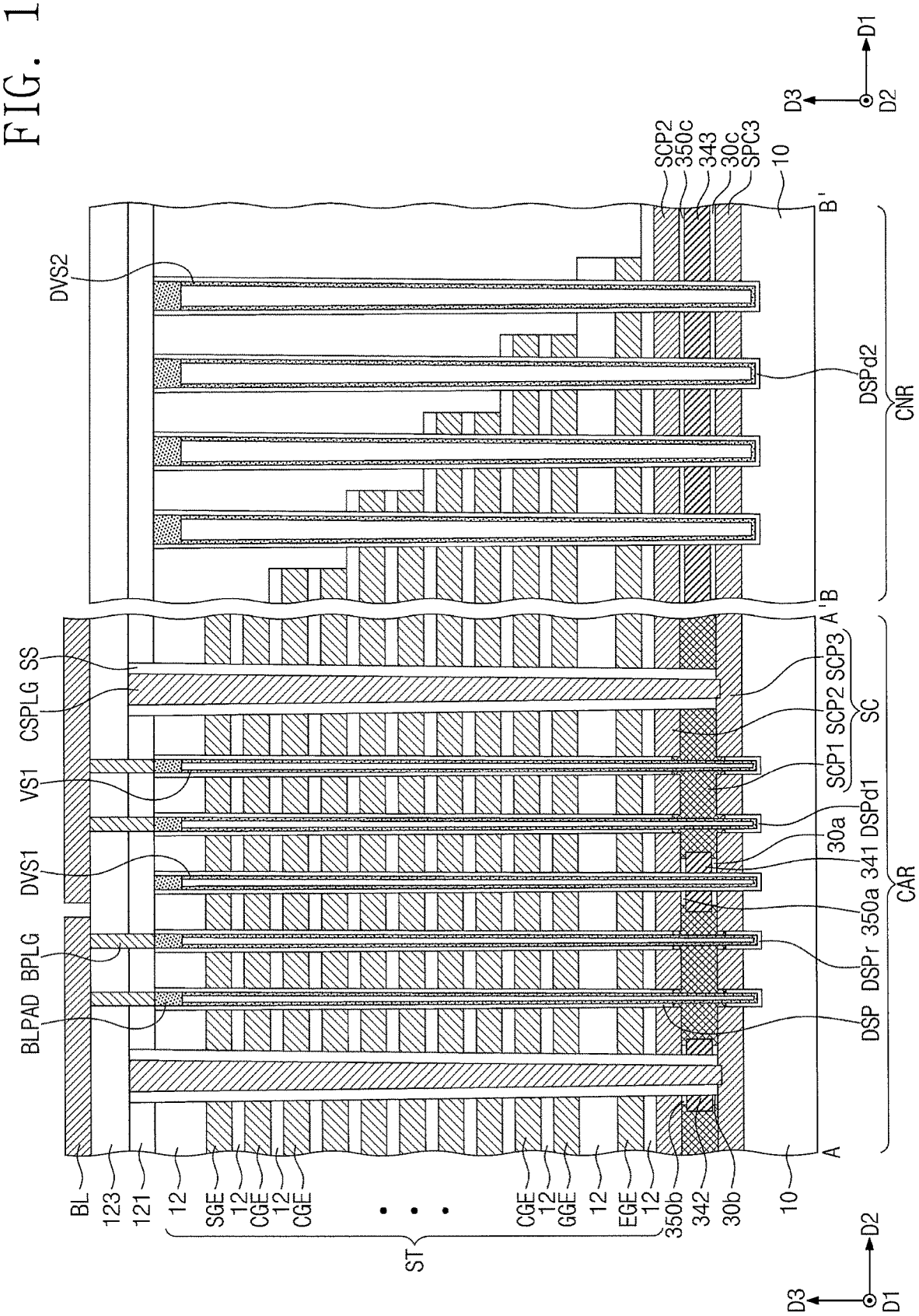
FIG. 12 is a cross-sectional view taken along lines A-A' and B-B' of FIG. 3, according to some embodiments of inventive concepts.

FIG. 12 is a cross-sectional view taken along lines A-A' and B-B' of FIG. 3, according to some embodiments of inventive concepts.

Referring to FIG. 12, a three-dimensional semiconductor memory device according to some embodiments may be configured such that the source contact plug CSPLG may penetrate the second support pattern 342 and the second auxiliary insulation pattern 30b and contact the third source conductive pattern SCP3. Unlike that shown in FIG. 9, the source contact plug CSPLG may have a bottom surface whose height is constant regardless of the position of the bottom surface.

Figure 13:
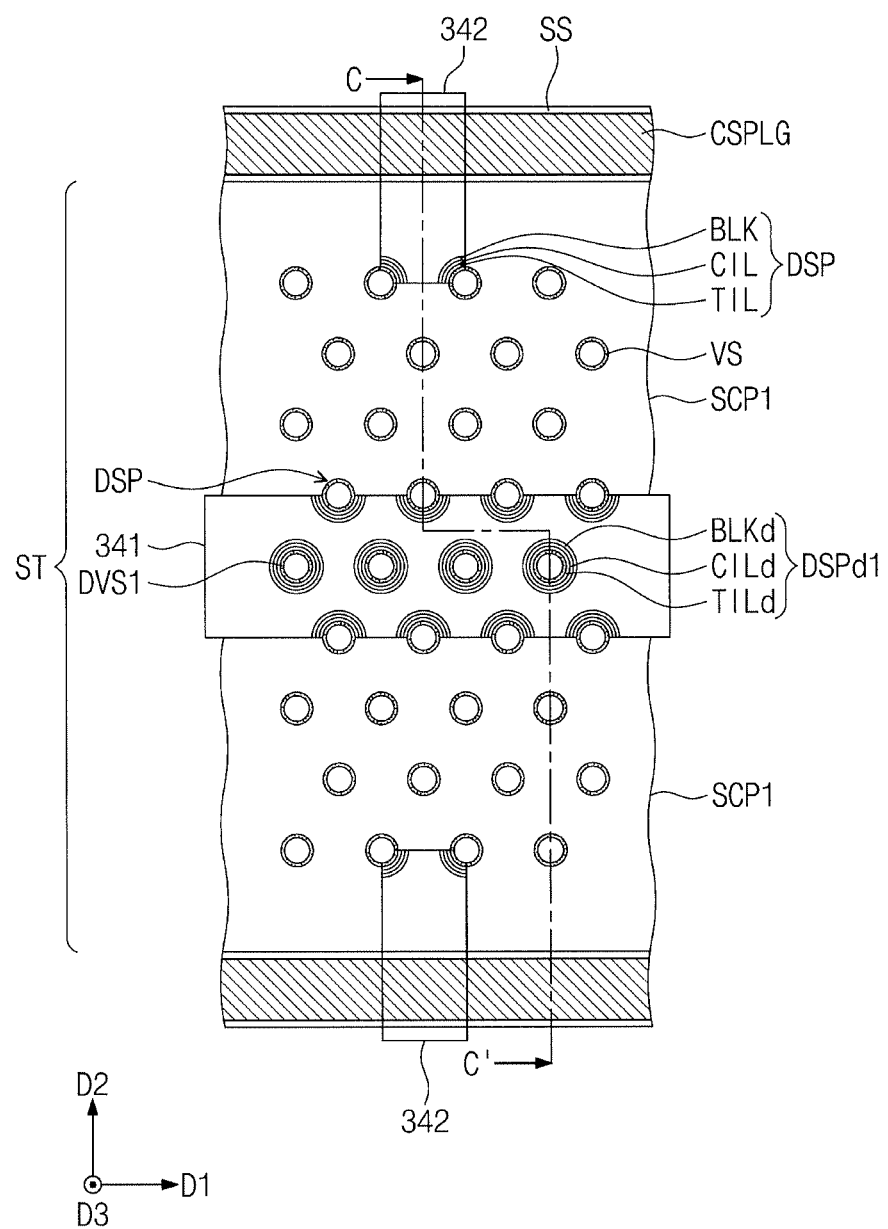
FIG. 13 is a detailed plan view illustrating a three-dimensional semiconductor memory device according to some embodiments of inventive concepts.
Figure 14:
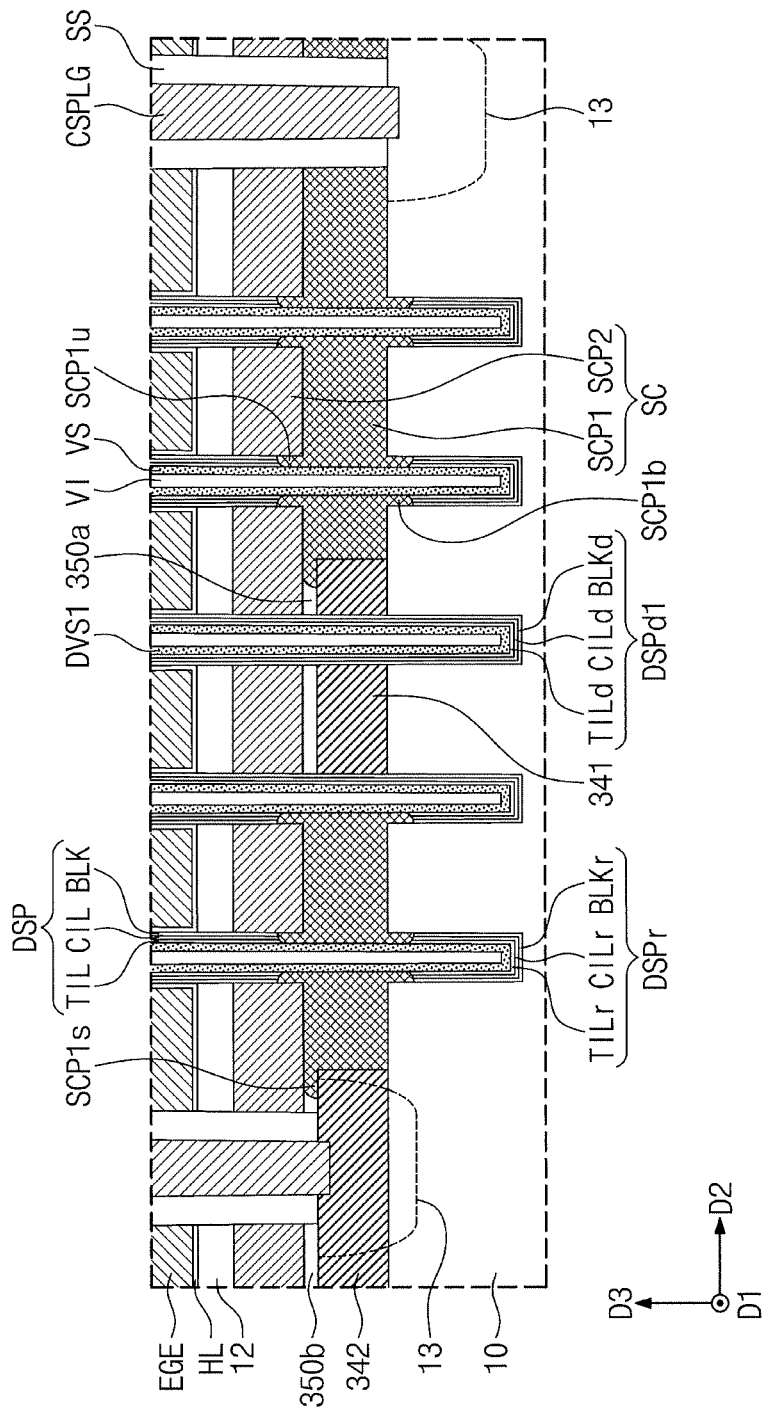
FIG. 14 is a cross-sectional view taken along line C-C' of FIG. 13, according to some embodiments of inventive concepts.

FIG. 13 is a detailed plan view illustrating a three-dimensional semiconductor memory device according to some embodiments of inventive concepts. In particular, FIG. 13 may correspond to a detailed plan view of a three-dimensional semiconductor memory device when seen from a height of the first source conductive pattern SCP1 shown in FIG. 14 or 15. FIG. 14 is a cross-sectional view taken along line C-C' of FIG. 13, according to some embodiments of inventive concepts.

Referring to FIGS. 13 and 14, when viewed in plan, the first support pattern 341 may extend in the second direction D2 and partially contact the sidewall of the cell vertical semiconductor pattern VS adjacent to the first dummy vertical semiconductor pattern DVS1. The cell data storage pattern DSP between the first support pattern 341 and the cell vertical semiconductor pattern VS may have a semicircular shape when viewed in plan. The second support pattern 342 may extend in the second direction D2 and partially contact the sidewall of the cell vertical semiconductor pattern VS adjacent to the source contact plug CSPLG. The cell data storage pattern DSP between the second support pattern 342 and the cell vertical semiconductor pattern VS may have a quarter-arc shape when viewed in plan.

As shown in FIG. 14, the cell data storage pattern DSP adjacent to the first dummy vertical semiconductor pattern DVS1 may not be separated. Accordingly, the residual cell data storage pattern DSPr may not be present below the cell vertical semiconductor pattern VS adjacent to the first dummy vertical semiconductor pattern DVS1. The cell data storage pattern DSP adjacent to the first dummy vertical semiconductor pattern DVS1 may contact the second source conductive pattern SCP2, the first insulation pattern 350a, the first support pattern 341, and the substrate 10. Other configurations and operations may be identical or similar to those discussed with reference to FIGS. 1 to 6B.

Figure 15:
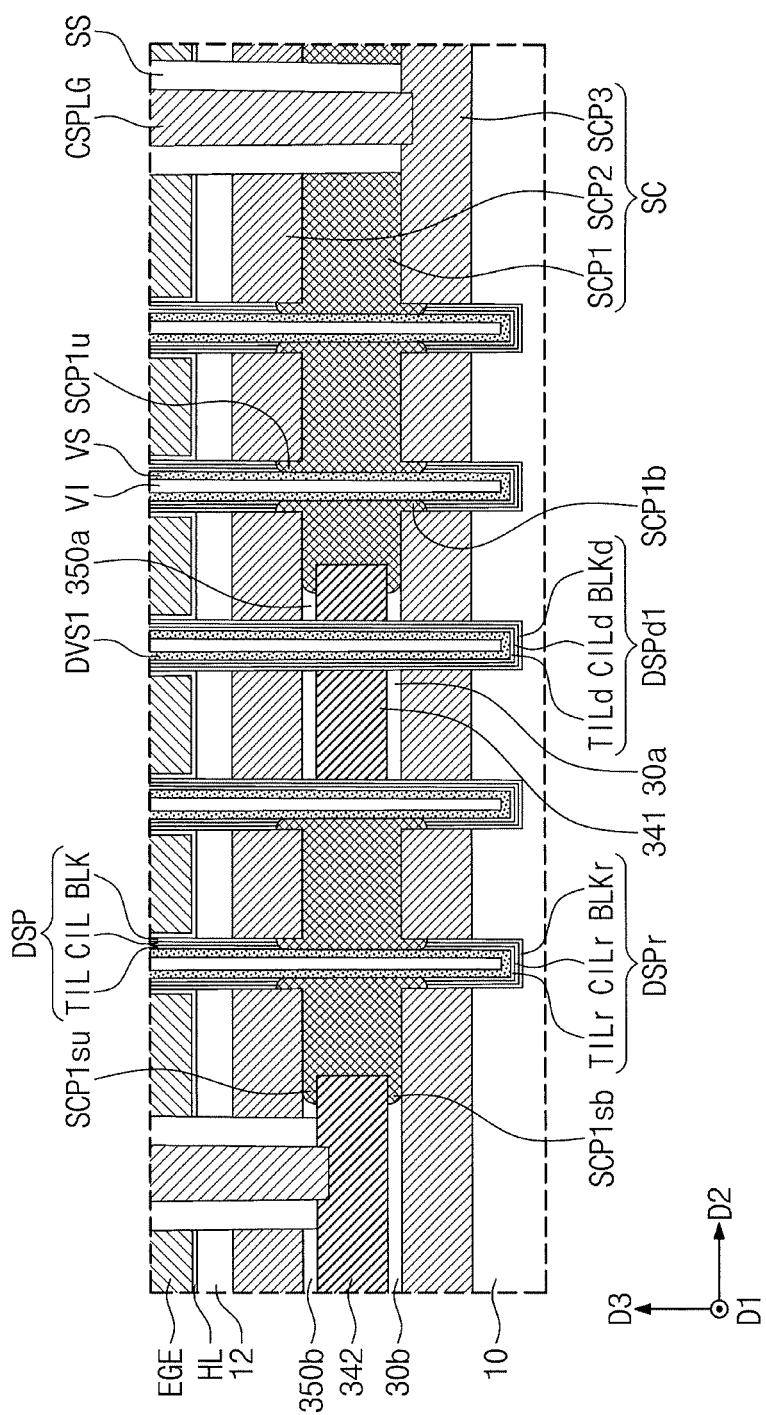
FIG. 15 is a cross-sectional view taken along line C-C' of FIG. 13, according to some embodiments of inventive concepts.

FIG. 15 is a cross-sectional view taken along line C-C' of FIG. 13, according to some embodiments of inventive concepts. FIG. 15 illustrates embodiments in which the embodiments of FIGS. 10 and 14 are combined.

Referring to FIGS. 13 and 15, the cell data storage pattern DSP adjacent to the first dummy vertical semiconductor pattern DVS1 may contact the second source conductive pattern SCP2, the first insulation pattern 350a, the first support pattern 341, the first auxiliary insulation pattern 30a, and the third source conductive pattern SCP3. Other configurations may be identical or similar to those discussed with reference to FIGS. 15 and 10.

Figure 16:
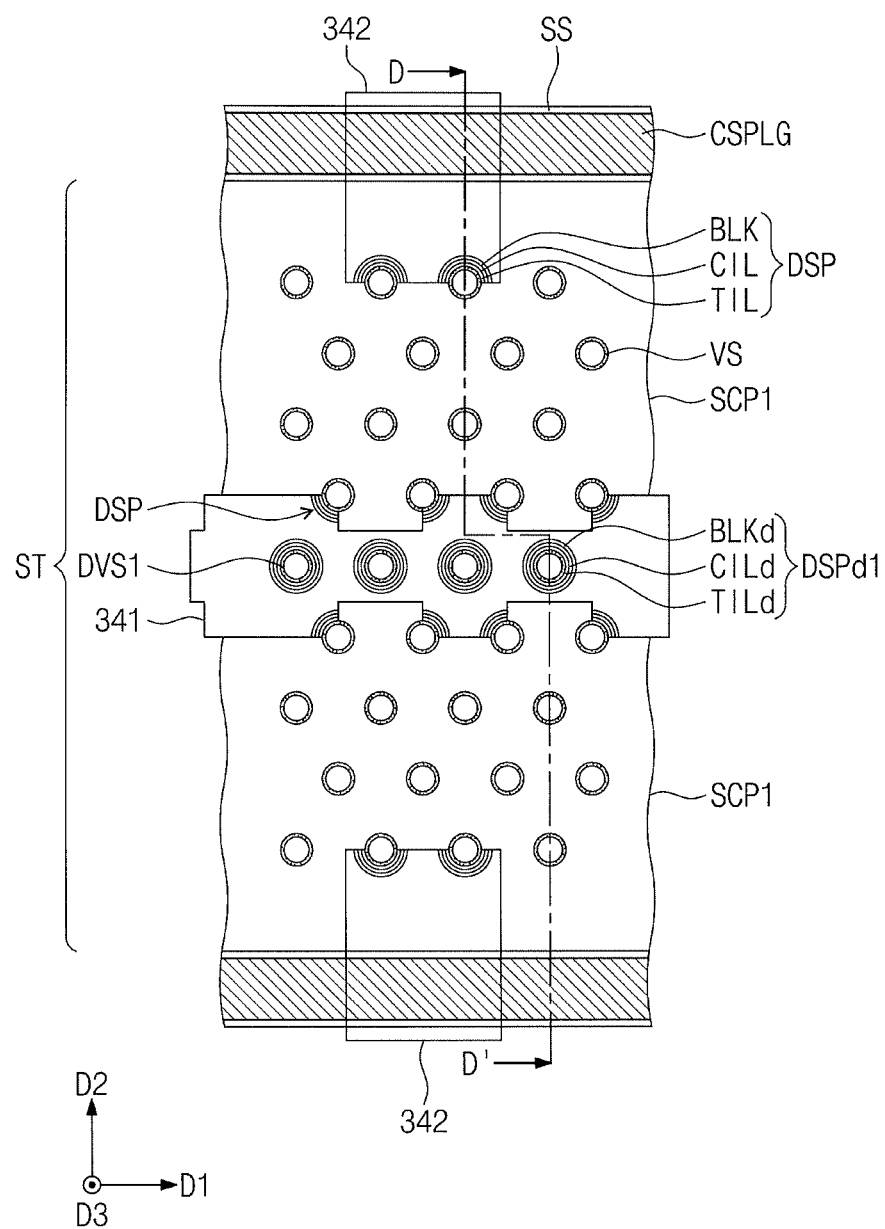
FIG. 16 is a detailed plan view illustrating a three-dimensional semiconductor memory device according to some embodiments of inventive concepts.
Figure 17:
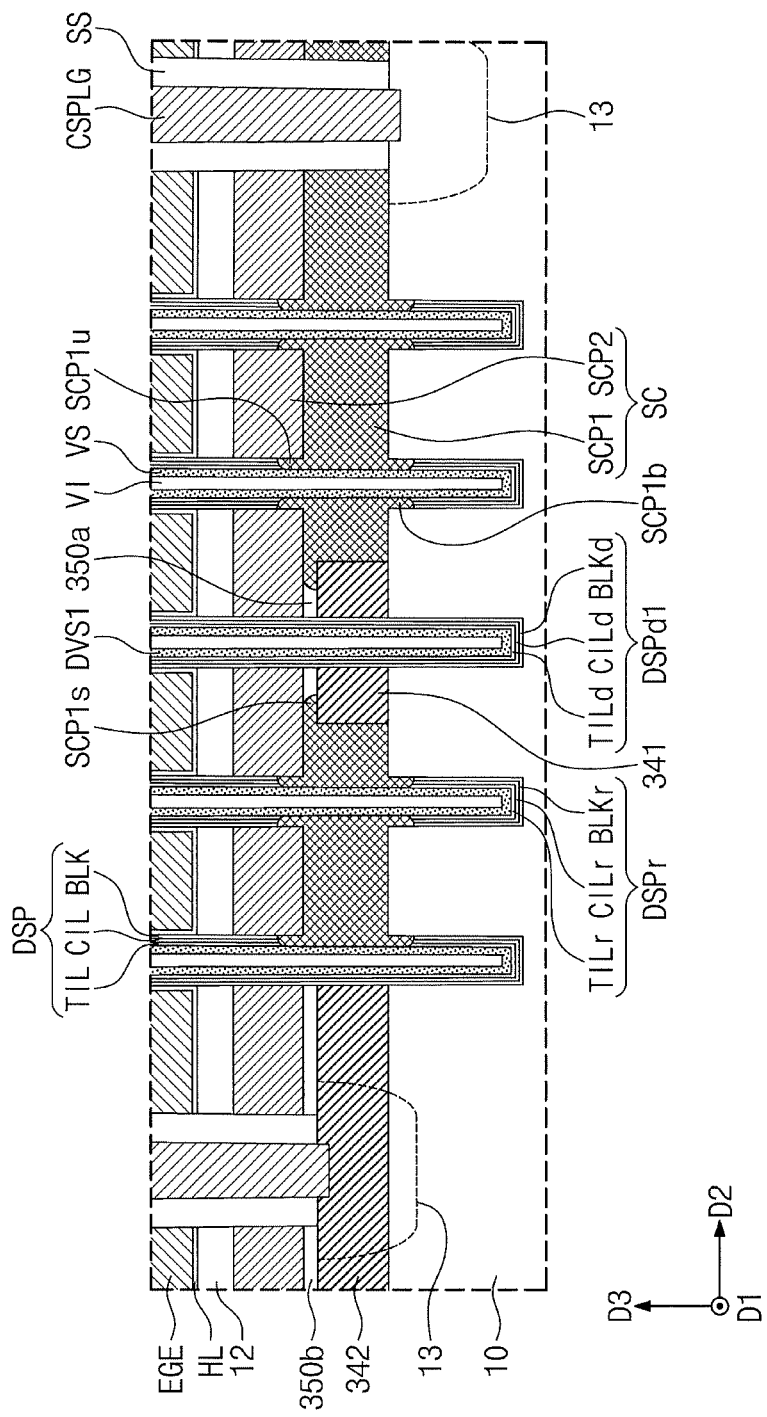
FIG. 17 is a cross-sectional view taken along line D-D' of FIG. 16, according to some embodiments of inventive concepts.

FIG. 16 is a detailed plan view illustrating a three-dimensional semiconductor memory device according to some embodiments of inventive concepts. In particular, FIG. 16 may correspond to a detailed plan view of a three-dimensional semiconductor memory device when seen from a height of the first source conductive pattern SCP1 shown in FIG. 17 or 18. FIG. 17 is a cross-sectional view taken along line D-D' of FIG. 16, according to some embodiments of inventive concepts.

Referring to FIGS. 16 and 17, when viewed in plan, a portion of the sidewall of the first support pattern 341 may extend in the second direction D2 and partially contact the sidewall of the cell vertical semiconductor pattern VS adjacent to the first dummy vertical semiconductor pattern DVS1. The sidewall of the first support pattern 341 may have an uneven structure when viewed in plan. The cell data storage pattern DSP between the first support pattern 341 and the cell vertical semiconductor pattern VS may have a quarter-arc shape when viewed in plan. The second support pattern 342 may extend in the first and second directions D1 and D2 and partially contact the sidewall of the cell vertical semiconductor pattern VS adjacent to the source contact plug CSPLG. The cell data storage pattern DSP between the second support pattern 342 and the cell vertical semiconductor pattern VS may have a semicircular shape when viewed in plan.

As shown in FIG. 17, the cell data storage pattern DSP adjacent to the source contact plug CSPLG may not be separated. Accordingly, the residual cell data storage pattern DSPr may not be present below the cell vertical semiconductor pattern VS adjacent to the source contact plug CSPLG. The cell data storage pattern DSP adjacent to the source contact plug CSPLG may contact the second source conductive pattern SCP2, the second insulation pattern 350$b$, the second support pattern 342, and the substrate 10.

Figure 18:
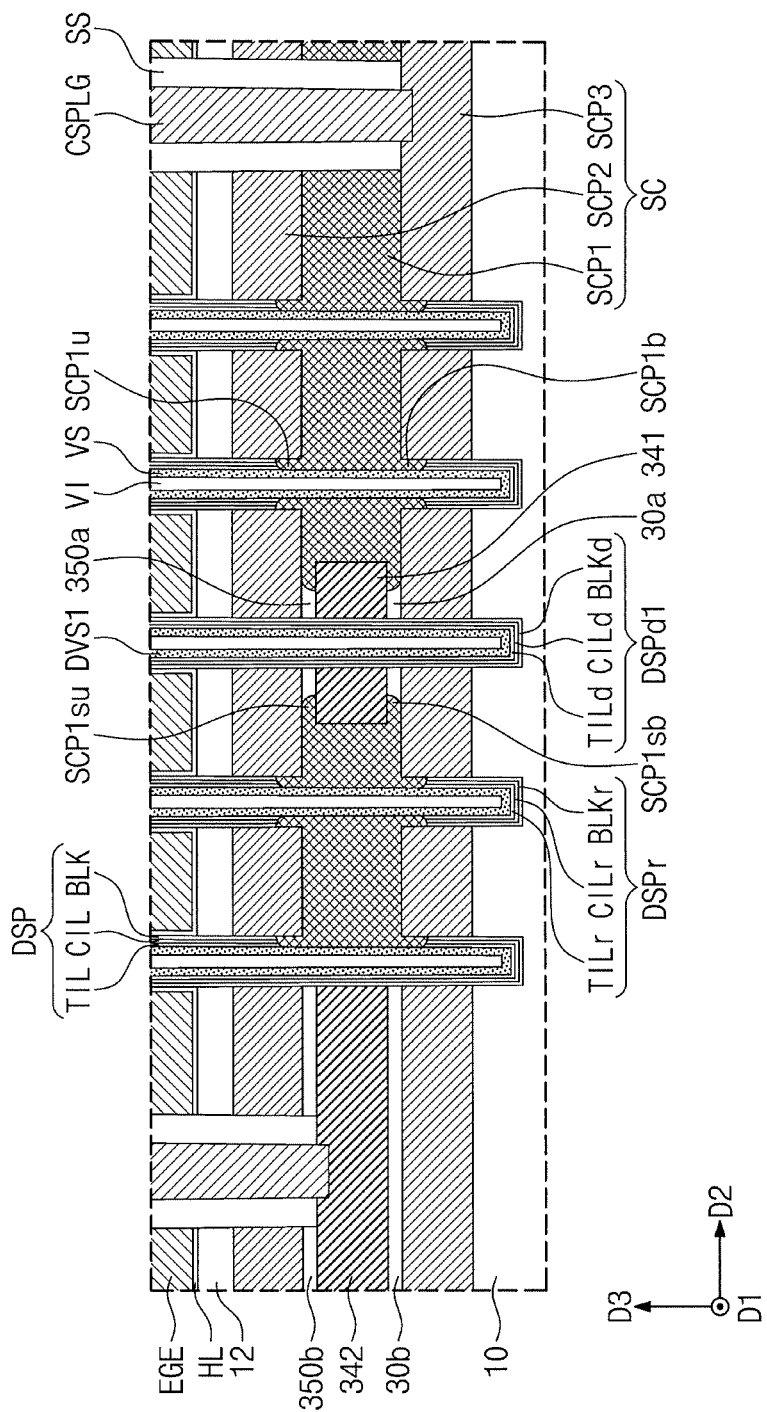
FIG. 18 is a cross-sectional view taken along line D-D' of FIG. 16, according to some embodiments of inventive concepts.

FIG. 18 is a cross-sectional view taken along line D-D' of FIG. 16, according to some embodiments of inventive concepts. FIG. 18 illustrates embodiments in which the embodiments of FIGS. 10 and 17 are combined.

Referring to FIGS. 18 and 16, the cell data storage pattern DSP adjacent to the source contact plug CSPLG may contact the second source conductive pattern SCP2, the second insulation pattern 350$b$, the second support pattern 342, the second auxiliary insulation pattern 30$b$, and the third source conductive pattern SCP3. Other configurations may be identical or similar to those discussed with reference to FIGS. 17 and 10.

A three-dimensional semiconductor memory device according to some embodiments of inventive concepts may include dummy vertical semiconductor patterns that are insulated from a source structure. As a result, during device operation, the dummy vertical semiconductor patterns may be satisfactorily floated and a leakage current path may be prevented.

The three-dimensional semiconductor memory device according to some embodiments of inventive concepts may include support patterns to prevent a mold structure from collapse during the fabrication of the three-dimensional semiconductor memory device.

Although the present inventive concepts have been described in connection with the embodiments of inventive concepts illustrated in the accompanying drawings, it will be understood to those skilled in the art that various changes and modifications may be made without departing from the technical spirit and essential features of the inventive concepts. It will be apparent to those skilled in the art that various substitution, modifications, and changes may be thereto without departing from the scope and spirit of the inventive concepts.

What is claimed is:

1. A three-dimensional semiconductor memory device, comprising:
    a substrate comprising a cell array region and a connection region;
    an electrode structure comprising a plurality of gate electrodes sequentially stacked on a surface of the substrate and extending from the cell array region to the connection region;
    a first source conductive pattern between the electrode structure and the substrate on the cell array region; and
    a cell vertical semiconductor pattern and a first dummy vertical semiconductor pattern on the cell array region, penetrating the electrode structure and the first source conductive pattern, and extending into the substrate,
    wherein the cell vertical semiconductor pattern contacts the first source conductive pattern, and
    wherein the first dummy vertical semiconductor pattern is electrically insulated from the first source conductive pattern.

2. The three-dimensional semiconductor memory device of claim 1, further comprising:
    a first dummy data storage pattern between the first dummy vertical semiconductor pattern and the first source conductive pattern, the first dummy data storage pattern contacting the first dummy vertical semiconductor pattern; and
    a first support pattern between the first dummy data storage pattern and the first source conductive pattern.

3. The three-dimensional semiconductor memory device of claim 2, further comprising:
    a source contact plug spaced apart from the cell vertical semiconductor pattern, penetrating the electrode structure, and electrically connected to the first source conductive pattern; and
    a second support pattern adjacent to the source contact plug.

4. The three-dimensional semiconductor memory device of claim 3, wherein the second support pattern is between the source contact plug and the substrate.

5. The three-dimensional semiconductor memory device of claim 3, wherein the second support pattern is between the source contact plug and the first source conductive pattern.

6. The three-dimensional semiconductor memory device of claim 3, wherein the source contact plug has a linear shape extending in a first direction from the cell array region into the connection region,
    wherein a bottom surface of the source contact plug has an uneven structure.

7. The three-dimensional semiconductor memory device of claim 2, further comprising a second source conductive pattern between the first source conductive pattern and the electrode structure, the second source conductive pattern contacting the first source conductive pattern,
    wherein the second source conductive pattern and the first support pattern are spaced apart from each other.

8. The three-dimensional semiconductor memory device of claim 7, further comprising a third source conductive pattern between the first source conductive pattern and the substrate, the third source conductive pattern contacting the first source conductive pattern,
    wherein the third source conductive pattern and the first support pattern are spaced apart from each other.

9. The three-dimensional semiconductor memory device of claim 7, further comprising an insulation pattern between the second source conductive pattern and the first support pattern,
    wherein a sidewall of the first support pattern laterally protrudes beyond an edge of the insulation pattern.

10. The three-dimensional semiconductor memory device of claim 2,
    wherein the cell vertical semiconductor pattern comprises a plurality of cell vertical semiconductor patterns that contact the first source conductive pattern, wherein the three-dimensional semiconductor memory device further comprises a plurality of cell data storage patterns, ones of the cell data storage patterns contacting sidewalls of respective ones of the plurality of cell vertical semiconductor patterns, and wherein at least one of the cell data storage patterns that is adjacent to the first support pattern contacts the first support pattern.

11. The three-dimensional semiconductor memory device of claim 10, wherein, from a plan view perspective, the at least one of the cell data storage patterns that contacts the first support pattern defines an arc shape at a height of the first support pattern.

12. The three-dimensional semiconductor memory device of claim 2, wherein, from a plan view perspective, the first support pattern defines a linear shape extending in a first direction towards the connection region.

13. The three-dimensional semiconductor memory device of claim 12, wherein, from the plan view perspective, a lateral surface of the first support pattern has an uneven structure.

14. The three-dimensional semiconductor memory device of claim 1, further comprising, on the connection region, a second dummy vertical semiconductor pattern penetrating an end of the electrode structure and extending into the substrate, wherein the second dummy vertical semiconductor pattern is electrically insulated from the first source conductive pattern.

15. The three-dimensional semiconductor memory device of claim 14, further comprising:

a second dummy data storage pattern contacting a lateral surface of the second dummy vertical semiconductor pattern; and a dummy support pattern adjacent to the second dummy data storage pattern.

16. The three-dimensional semiconductor memory device of claim 15, wherein the dummy support pattern covers the connection region.

17. A three-dimensional semiconductor memory device, comprising:

an electrode structure comprising a plurality of gate electrodes sequentially stacked on a substrate;

a source structure between the electrode structure and the substrate;

a bit line on the electrode structure; and a dummy vertical semiconductor pattern penetrating the electrode structure and the source structure and extending into the substrate, the dummy vertical semiconductor pattern being electrically insulated from the bit line and electrically insulated from the source structure.

18. The three-dimensional semiconductor memory device of claim 17, further comprising a cell vertical semiconductor pattern penetrating the electrode structure and the source structure and extending into the substrate, the cell vertical semiconductor pattern being spaced apart from the dummy vertical semiconductor pattern, wherein a lateral surface of the cell vertical semiconductor pattern contacts the source structure.

19. A three-dimensional semiconductor memory device, comprising:

an electrode structure comprising a plurality of gate electrodes sequentially stacked on a substrate;

a source structure between the electrode structure and the substrate;

a cell vertical semiconductor pattern on the substrate, the cell vertical semiconductor pattern penetrating the electrode structure and penetrating the source structure; and a source contact plug penetrating the electrode structure and electrically connected to the source structure, wherein a bottom surface of the source contact plug has an uneven structure.

20. The three-dimensional semiconductor memory device of claim 19, further comprising a support pattern between the source contact plug and the substrate.

* * * * *